US007825660B2

(12) United States Patent
Yui et al.

(10) Patent No.: US 7,825,660 B2
(45) Date of Patent: *Nov. 2, 2010

(54) MAGNETIC RESONANCE IMAGING APPARATUS AND MAGNETIC RESONANCE IMAGING METHOD

(75) Inventors: Masao Yui, Otawara (JP); Yoshimori Kassai, Nasushiobara (JP); Shigehide Kuhara, Otawara (JP)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 112 days.

This patent is subject to a terminal disclaimer.

(21) Appl. No.: 12/076,166

(22) Filed: Mar. 14, 2008

(65) Prior Publication Data

US 2008/0231271 A1    Sep. 25, 2008

Related U.S. Application Data

(63) Continuation of application No. 11/699,325, filed on Jan. 30, 2007, now Pat. No. 7,365,543.

(30) Foreign Application Priority Data

Feb. 6, 2006   (JP) .............................. 2006-028286
Dec. 8, 2006   (JP) .............................. 2006-332465

(51) Int. Cl.
*G01V 3/00*   (2006.01)

(52) U.S. Cl. ...................................... 324/306; 324/309

(58) Field of Classification Search ................. 324/306, 324/309, 307

See application file for complete search history.

(56) References Cited

U.S. PATENT DOCUMENTS

| 5,379,766 | A  | 1/1995 | McKinnon et al. |
| 6,070,095 | A  | 5/2000 | McKinnon et al. |
| 6,171,241 | B1 | 1/2001 | McVeigh et al.  |
| 6,188,922 | B1 | 2/2001 | Mistretta et al.|

(Continued)

FOREIGN PATENT DOCUMENTS

JP   2000-41970   2/2000

(Continued)

OTHER PUBLICATIONS

Lui et al., "A Monitoring Feedback, and Triggering System for Reproducible Breath-Hold MR Imaging", Magentic Resonance in Medicine, vol. 30, No. 4, pp. 507-511 (1993).

(Continued)

Primary Examiner—Louis M Arana
(74) Attorney, Agent, or Firm—Nixon & Vanderhye PC

(57) ABSTRACT

An MRI apparatus includes an imaging signal acquisition unit, a motion signal acquisition unit, a motion amount determination unit, a motion correction unit and an image reconstruction unit. The imaging signal acquisition unit acquires MR signals as imaging signals. The motion signal acquisition unit repetitively acquires MR signals having PE amount less than that of the imaging signals as motion signals. The motion amount determination unit obtains a motion amount using the motion signals. The motion correction unit performs correction processing of the imaging signals in accordance with the motion amount. The image reconstruction unit reconstructs an image using the imaging signals after the correction processing.

13 Claims, 19 Drawing Sheets

U.S. PATENT DOCUMENTS

| | | | |
|---|---|---|---|
| 6,453,187 | B1 | 9/2002 | Prince et al. |
| 6,597,935 | B2 | 7/2003 | Prince et al. |
| 6,777,933 | B2 * | 8/2004 | Stoyle .................. 324/306 |
| 6,892,089 | B1 | 5/2005 | Prince et al. |
| 6,954,067 | B2 | 10/2005 | Mistretta |
| 7,049,816 | B2 | 5/2006 | Mistretta et al. |
| 7,358,728 | B2 * | 4/2008 | Nozaki et al. ............. 324/307 |
| 7,365,543 | B2 * | 4/2008 | Yui et al. .................. 324/318 |
| 7,557,575 | B2 * | 7/2009 | Ookawa et al. ............ 324/309 |
| 2001/0043069 | A1 | 11/2001 | Nehrke et al. |
| 2006/0079754 | A1 | 4/2006 | Welch et al. |
| 2007/0156044 | A1 | 7/2007 | Mistretta et al. |

FOREIGN PATENT DOCUMENTS

| | | |
|---|---|---|
| WO | 02/084318 A1 | 10/2002 |
| WO | 2004/046746 A1 | 6/2004 |

OTHER PUBLICATIONS

Ehman et al., "Adaptive Technique for High-Definition MR Imaging of Moving Structures", Radiology, vol. 173, No. 1, pp. 255-263 (1989).

Oshio, "Whole Heart Coronary Angiogrraphy Using Self-Navigated 'Paddle-Wheel' Balanced SSFP", Proc. Intl. Soc. Mag. Reson. Med., vol. 13, p. 707 (2005.

Extended European Search Report dated Jan. 22, 2010 in EP 07002298.3.

Yui M., et al., "Motion measurement using echoes during SSFP dummy cycles for whole-heart MR coronary artery," Proceedings of the International Society for Magnetic Resonance in Medicine, $14^{th}$ Scientific Meeting and Exhibition, Seattle, Washington, USA, May 6-12, 2006, p. 2158, XP002562504.

Jung Bemd et al., "Navigation of the heart with single-shot images," Proceedings of the International Society for Magnetic Resonance in Medicine, $8^{th}$ Scientific Meeting and Exhibition, Glasgow, Scotland, UK, Apr. 21-27, 2001, p. 753, XP 002562505.

Kadah Y. M. et al., "Floating navigator echo (FNAV) for in-plane 2D translational motion estimation," Magnetic Resonance in Medicine, Academic Press, Duluth, MN, US, vol. 51, 2004, pp. 403-407, XP 002562506.

Manke D. et al., "Novel prospective respiratory motion correction approach for free-breathing coronary MR angiography using a patient-adapted affine motion model," Magnetic Resonance in Medicine, Academic Press, Duluth, MN, US, vol. 50, No. 1, Jul. 1, 2003, pp. 122-131, XP 002342540, ISSN: 0740-3194.

Nehrke K, Börnert, P., "Prospective correction of affine motion for arbitrary MR sequences on a clinical scanner," Magnetic Resonance in Medicine, Academic Press, Duluth, MN, US, vol. 54, 2005, pp. 1130-1138, XP 002562508.

Li J. M. et al., "Respiratory self-navigated SSFP," Proceedings of the International Society for Magnetic Resonance in Medicine, $13^{th}$ Scientific Meeting and Exhibition, Miami Beach, Florida, USA, May 7-13, 2005, p. 2234, XP 002562509.

Gatehouse P. D. , Firmin D. N., "Respiratory navigators in non-stop cine cardiovascular SSFP imaging," Proceedings of the International Society for Magnetic Resonance in Medicine, $12^{th}$ Scientific Meeting and Exhibition, Kyoto, Japan, May 15-21, 2004, p. 1963, XP 002562510.

Schaffer R. W. et al., "Calculating a reference from navigators placed over the heart," Proceedings of the International Society for Magnetic Resonance in Medicine, $10^{th}$ Scientific Meeting and Exhibition, Honolulu, Hawaii, USA, May 18-24, 2002, p. 2308, XP 002562511.

* cited by examiner

MAGNETIC RESONANCE IMAGING APPARATUS AND MAGNETIC RESONANCE IMAGING METHOD

CROSS REFERENCE TO RELATED APPLICATION

This application is a continuation of U.S. patent application Ser. No. 11/699,325 filed Jan. 30, 2007 (now issued U.S. Pat. No. 7,365,543), which claimed priority from Japanese applications No. 2006-028286 filed Feb. 6, 2006, and No. 2006-332465 filed Dec. 8, 2006, the entire disclosures of which priority applications are incorporated herein by reference.

BACKGROUND OF THE INVENTION

1. Field of the Invention

The present invention relates to a magnetic resonance imaging apparatus and a magnetic resonance imaging method which generate gradient magnetic fields on an imaging area formed in a static magnetic field, resonates nuclear spins in the object set in the imaging area magnetically by transmitting radio frequency signals and reconstructs an image of the object by using nuclear magnetic resonance signals generated due to an excitation, and more particularly, to a magnetic resonance imaging apparatus and a magnetic resonance imaging method in which influence of motion of the object on an image is reduced by correction.

2. Description of the Related Art

An MRI (Magnetic Resonance Imaging) apparatus is an apparatus which generates gradient magnetic fields by gradient coils on an imaging area of an object set in a cylindrical static field magnet for producing a static magnetic field, resonates nuclear spins in the object magnetically by transmitting RF (Radio Frequency) signals from an RF coil and reconstructs an image of the object by using NMR (Nuclear Magnetic Resonance) signals generated due to an excitation.

Imaging of the heart under a magnetic resonance imaging method with use of the magnetic resonance imaging apparatus has been further developed in recent years. Typical applications of the imaging of the heart include high resolution imaging for the blood vessel figure of the coronary artery. In the high resolution imaging for the coronary artery, an influence of a breathing motion on an image needs to be reduced as much as possible.

One of measurements for suppressing the influence of the breathing motion is breath-holding imaging in which the imaging is performed when the breath is held. However, in the breath-holding imaging, the imaging is only performed during a breath-holding period and there is a limitation on the resolution. In addition, there is a fear in the degree of stability of the breath-holding.

Another method of suppressing the influence of the breathing motion relies on a technique of using synchronous imaging as well under a free breath condition. A synchronous signal used in the synchronous imaging can be obtained by an expansion and contraction sensor or a pressure sensor arranged around the abdominal part of an object. However, there is a problem in that this synchronous imaging method with use of the synchronous signal obtained by the expansion and contraction sensor or the pressure sensor has insufficient accuracy.

In view of the above, another method instead of the synchronous imaging method with use of the expansion and contraction sensor or the pressure sensor, there are proposed a synchronous imaging method in which the position of the diaphragm detected on the basis of NMR signals from the diaphragm is used as a synchronous signal (for example, Liu et al., Magnetic Resonance In Medicine, 30, pages 507-511, (1993)) and an imaging method for reflecting positional information of a moving imaging area on a control for collecting the NMR signals for imaging to finely adjust an excited slice position.

FIG. 22 is a diagram explaining an area for acquiring NMR signals for detecting motion of a diaphragms in a conventional magnetic resonance imaging apparatus. FIG. 23 is a diagram showing a conventional pulse sequence defining an imaging condition to acquire data for detecting motion and that for imaging shown in FIG. 22.

In a synchronous imaging method using the position of the diaphragm as the synchronous signal, as shown in the solid line frame of FIG. 22, other than a data collection area for imaging including the heart, an area on the cylinder as shown in the dotted line frame including the diaphragm is set as the data collection area for the motion detection.

Then, the imaging is executed in accordance with the pulse sequence shown in FIG. 23. In the general pulse sequence, a pre-pulse such as a fat suppression pulse is used in combination in many times, and prior to the sequence for imaging, a sequence for applying the pre-pulse is set. Then, prior to the sequence for the pre-pulse, a sequence for the motion detection is set.

In addition, a sequence for applying dummy shots (which is also referred to as stabilization shots) for acquiring data necessary for post-processing on data or information which is required in collecting data for imaging is set at the start of the data collection for imaging. Normally, the slice direction of the dummy shot is set to an axial cross-section for the purpose of realizing the stabilization of spinning similarly to the data collection for imaging.

Then, on the basis of the sequence for the motion detection, the data collection area for the motion detection including the diaphragm is excited in a particular condition different from the exciting method for the imaging area. Furthermore, the data for the motion detection is acquired from the collection area including the diaphragm and a signal called navigator is generated. Next, the position of the diaphragm is detected from the navigator signal, and a control method for hardware at the time of imaging is determined and adoption judgment as to the data collection for imaging is conducted in accordance with the amount of change in the position of the diaphragm. In addition, the amount of the breathing-related shift on the heart necessary for the motion correction on the data for imaging is calculated by multiplying the amount of shift of the diaphragm by a given ratio.

Such a navigator method in which the sequence for the motion detection which is different from the sequence for imaging is used for collecting the navigator signal to acquire the synchronous signal is applied to various technologies.

However, the navigator method for collecting the navigator signal under a condition different from the data collection condition for imaging has two major problems.

The first problem resides in that the amount of breath-related shift of the target area of the imaging (the heart) and the amount of shift of the area to be observed by the navigator signal (the diaphragm) have relevance but are not completely the same to each other. Therefore, the amount of shift of the heart is estimated from the amount of shift of the diaphragm, which is a cause of decreasing the accuracy. In addition, a ratio between the amount of breath-related shift of the heart and the amount of shift of the diaphragm varies between individuals and changes depending on the state of breathing even in the same object, and it is therefore difficult to obtain a stable image.

The second problem resides in that timing for detecting the signal from the diaphragm is largely different from timing for detecting the signal for imaging. It is necessary to continuously perform the application of the pre-pulse and the data collection for imaging to be executed after application of the pre-pulse. Therefore, the timing for collecting the navigator signal on the basis of the sequence for collecting the navigator signal (navigator sequence) disadvantageously needs to be separated in view of time from timing for collecting the data on the basis of the sequence for imaging. Then, the shift of the timing for collecting the navigator signal from the timing for the data collection for imaging becomes a cause of decreasing the accuracy in a case where a breath period of the object is relatively short.

On the other hand, as another method for detecting the motion of the diaphragm, a method of generating a navigator signal even during data collection for imaging by using a pulse sequence for imaging is proposed (for example, Ehman, Felmee, Radiology, 173, pages 255-263, (1989)).

This technique for generating the navigator signal during the data collection for imaging includes generating a plurality of echo signals in a spin echo sequence and utilizing one of the thus generated echo signals as the navigator signal. According to this technique, the motion information in the readout direction and the phase encode direction can be observed. Then, this technique has a merit of collecting the navigator signal and the signal for imaging substantially at the same timing as well as a merit of observing the motion of the same area as the imaging target, that is, the motion of the heart.

However, the conventional technology for generating the navigator signal during the data collection for imaging suffers a problem of difficulty in observing the motion at a practically sufficient accuracy. This accuracy deficient problem arises because the navigator signal is data obtained by projecting data from the object in a particular direction. That is, the navigator signal is data obtained by superposing data from the area which is not in motion in actuality onto data from the area which is in motion as being the projection data in the particular direction. Thus, the navigator signal is under influence of the area that is not in motion.

For example, in the thoraco-abdominal area, fats on the body surface, the chest wall, muscles of the back, and the like are not in motion. However, these unmoved areas are closer to the reception coil than moving areas such as the liver, and accordingly the signal intensity from the unmoved area is relatively larger than the signal intensity from the moving area. Therefore, the accuracy in detection of the motion is easily influenced by the unmoved area, and particularly in a case of imaging requiring a high accuracy such as high resolution imaging, the influence of the unmoved area on the motion detection accuracy becomes a problem.

SUMMARY OF THE INVENTION

The present invention has been made in light of the conventional situations, and it is an object of the present invention to provide a magnetic resonance imaging apparatus and a magnetic resonance imaging method which make it possible to obtain an image with highly accurate motion correction by acquiring motion signals sufficient for observing motion amount directly from a part which is an imaging target and nearly simultaneously with data acquisition for imaging.

Furthermore, it is another object of the present invention to provide a magnetic resonance imaging apparatus and a magnetic resonance imaging method which make it possible to obtain an image with highly accurate motion correction by reducing influence of parts which do not move.

The present invention provides a magnetic resonance imaging apparatus comprising: an imaging signal acquisition unit configured to acquire magnetic resonance signals from an object as imaging signals; a motion signal acquisition unit configured to repetitively acquire magnetic resonance signals having phase encode amount less than that of the imaging signals as motion signals; a motion amount determination unit configured to obtain a motion amount using the motion signals; a motion correction unit configured to perform correction processing of the imaging signals in accordance with the motion amount; and an image reconstruction unit configured to reconstruct an image using the imaging signals after the correction processing, in an aspect to achieve the object.

The present invention also provides a magnetic resonance imaging apparatus comprising: an imaging signal acquisition unit configured to acquire magnetic resonance signals from an object as imaging signals; a motion signal acquisition unit configured to obtain a part of the imaging signals and magnetic resonance signals having phase encode amount less than that of the imaging signals as motion signals; a motion amount determination unit configured to obtain a motion amount using the motion signals; a motion correction unit configured to perform correction processing of the imaging signals in accordance with the motion amount; and an image reconstruction unit configured to reconstruct an image using the imaging signals after the correction processing, in an aspect to achieve the object.

The present invention also provides a magnetic resonance imaging apparatus comprising: an imaging signal acquisition unit configured to acquire magnetic resonance signals from an object as imaging signals; a motion signal acquisition unit configured to repetitively acquire magnetic resonance signals having phase encode amount less than that of the imaging signals as motion signals; a motion amount determination unit configured to obtain a motion amount using the motion signals; a selection unit configured to select imaging signals within a specific range in accordance with the motion amount; and an image reconstruction unit configured to reconstruct an image using the imaging signals within the specific range, in an aspect to achieve the object.

The present invention also provides a magnetic resonance imaging apparatus further comprising a motion reflected component acquisition unit configured to acquire signal component reflecting a motion from the motion signals, wherein said motion amount determine unit is configured to obtain the motion amount from the signal component reflecting the motion, in an aspect to achieve the object.

The present invention also provides a magnetic resonance imaging method comprising steps of: acquiring magnetic resonance signals from an object as imaging signals; repetitively acquiring magnetic resonance signals having phase encode amount less than that of the imaging signals as motion signals; obtaining a motion amount using the motion signals; performing correction processing of the imaging signals in accordance with the motion amount; and reconstructing an image using the imaging signals after the correction processing, in an aspect to achieve the object.

The present invention also provides a magnetic resonance imaging method comprising steps of: acquiring magnetic resonance signals from an object as imaging signals; obtaining a part of the imaging signals and magnetic resonance signals having phase encode amount less than that of the imaging signals as motion signals; obtaining a motion amount using the motion signals; performing correction processing of the imaging signals in accordance with the motion amount; and reconstructing an image using the imaging signals after the correction processing, in an aspect to achieve the object.

The present invention also provides a magnetic resonance imaging method comprising steps of: acquiring magnetic resonance signals from an object as imaging signals; repetitively acquiring magnetic resonance signals having phase encode amount less than that of the imaging signals as motion signals; obtaining a motion amount using the motion signals; selecting imaging signals within a specific range in accordance with the motion amount; and reconstructing an image using the imaging signals within the specific range, in an aspect to achieve the object.

The magnetic resonance imaging apparatus and the magnetic resonance imaging method as described above make it possible to obtain an image with highly accurate motion correction by acquiring motion signals sufficient for observing motion amount directly from a part which is an imaging target and nearly simultaneously with data acquisition for imaging.

Furthermore, it is possible to obtain an image with highly accurate motion correction by reducing influence of parts which do not move.

DESCRIPTION OF THE PREFERRED EMBODIMENTS

A magnetic resonance imaging apparatus and a magnetic resonance imaging method according to embodiments of the present invention will be described with reference to the accompanying drawings.

Figure 1:
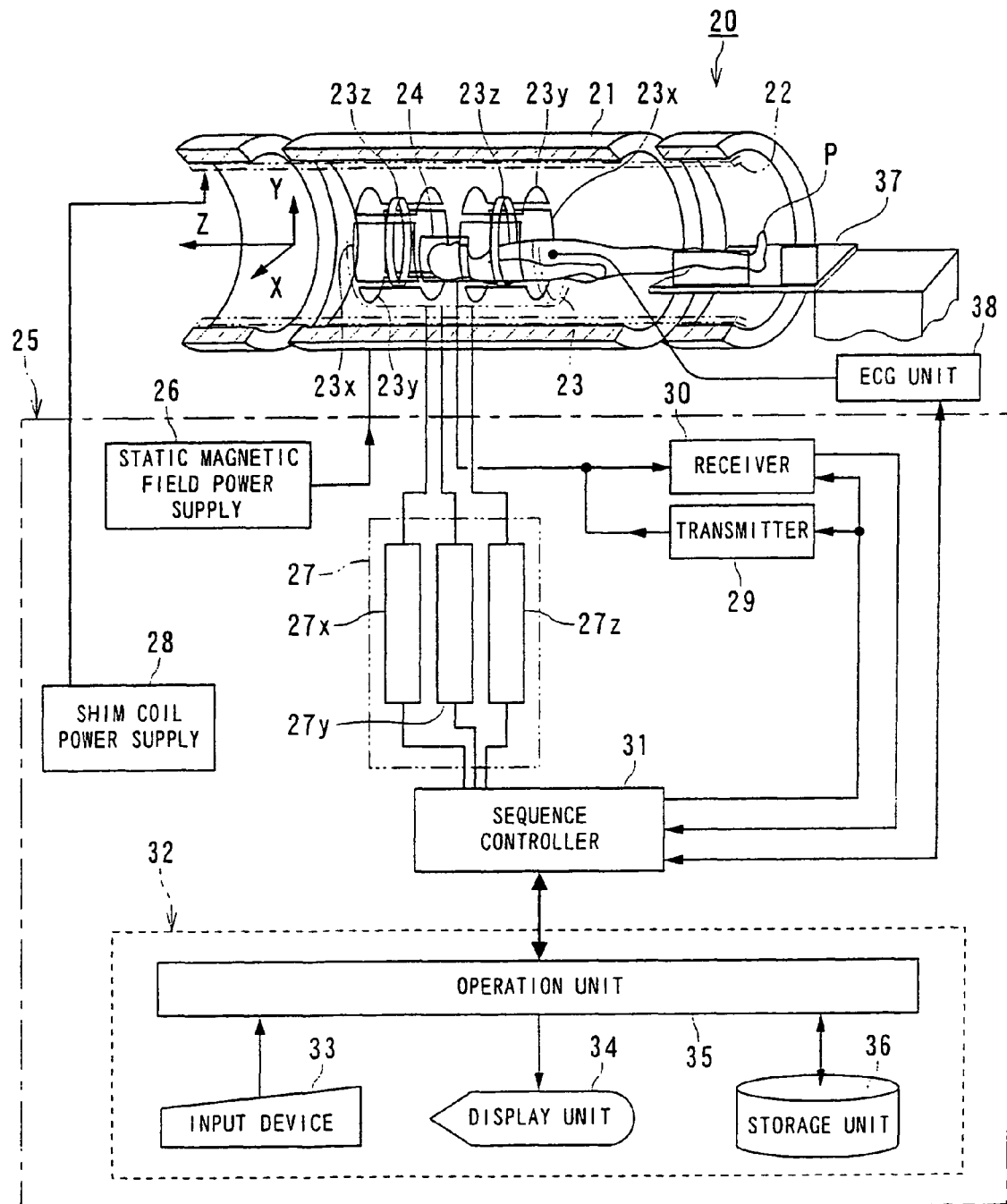
FIG. 1 is a block diagram showing a magnetic resonance imaging apparatus according to a first embodiment of the present invention.

FIG. 1 is a block diagram showing a magnetic resonance imaging apparatus according to a first embodiment of the present invention.

A magnetic resonance imaging apparatus 20 shown in FIG. 1 includes a static field magnet 21 for generating a static magnetic field, a shim coil 22 arranged inside the static field magnet 21 which is cylinder-shaped, a gradient coil unit 23 and a RF coil 24. The static field magnet 21, the shim coil 22, the gradient coil unit 23 and the RF coil 24 are built in a gantry (not shown).

The magnetic resonance imaging apparatus 20 also includes a control system 25. The control system 25 includes a static magnetic field power supply 26, a gradient power supply 27, a shim coil power supply 28, a transmitter 29, a receiver 30, a sequence controller 31 and a computer 32. The gradient power supply 27 of the control system 25 includes an X-axis gradient power supply 27x, a Y-axis gradient power supply 27y and a Z-axis gradient power supply 27z. The computer 32 includes an input device 33, a display unit 34, an operation unit 35 and a storage unit 36.

The static field magnet 21 communicates with the static magnetic field power supply 26. The static magnetic field power supply 26 supplies electric current to the static field magnet 21 to get the function to generate a static magnetic field in an imaging region. The static field magnet 21 includes a superconductivity coil in many cases. The static field magnet 21 gets current from the static magnetic field power supply 26 which communicates with the static field magnet 21 at excitation. However, once excitation has been made, the static field magnet 21 is usually isolated from the static magnetic field power supply 26. The static field magnet 21 may include a permanent magnet which makes the static magnetic field power supply 26 unnecessary.

The static field magnet 21 has the cylinder-shaped shim coil 22 coaxially inside itself. The shim coil 22 communicates with the shim coil power supply 28. The shim coil power supply 28 supplies current to the shim coil 22 so that the static magnetic field becomes uniform.

The gradient coil unit 23 includes an X-axis gradient coil unit 23x, a Y-axis gradient coil unit 23y and a Z-axis gradient coil unit 23z. Each of the X-axis gradient coil unit 23x, the Y-axis gradient coil unit 23y and the Z-axis gradient coil unit 23z which is cylinder-shaped is arranged inside the static field magnet 21. The gradient coil unit 23 has also a bed 37 in the area formed inside it which is an imaging area. The bed 37 supports an object P. Around the bed 37 or the object P, the RF coil 24 may be arranged instead of being built in the gantry.

The gradient coil unit 23 communicates with the gradient power supply 27. The X-axis gradient coil unit 23x, the Y-axis gradient coil unit 23y and the Z-axis gradient coil unit 23z of the gradient coil unit 23 communicate with the X-axis gradient power supply 27x, the Y-axis gradient power supply 27y and the Z-axis gradient power supply 27z of the gradient power supply 27 respectively.

The X-axis gradient power supply 27x, the Y-axis gradient power supply 27y and the Z-axis gradient power supply 27z supply currents to the X-axis gradient coil unit 23x, the Y-axis gradient coil unit 23y and the Z-axis gradient coil unit 23z respectively so as to generate gradient magnetic fields Gx, Gy and Gz in the X, Y and Z directions in the imaging area.

The RF coil 24 communicates with the transmitter 29 and the receiver 30. The RF coil 24 has a function to transmit a RF signal given from the transmitter 29 to the object P and receive a NMR signal generated due to an nuclear spin inside the object P which is excited by the RF signal to give to the receiver 30.

The sequence controller 31 of the control system 25 communicates with the gradient power supply 27, the transmitter 29 and the receiver 30. The sequence controller 31 has a function to storage sequence information describing control information needed in order to make the gradient power supply 27, the transmitter 29 and the receiver 30 drive and generate gradient magnetic fields Gx, Gy and Gz in the X, Y and Z directions and a RF signal by driving the gradient power supply 27, the transmitter 29 and the receiver 30 according to a predetermined sequence stored. The control information above-described includes motion control information, such as intensity, impression period and impression timing of the pulse electric current which should be impressed to the gradient power supply 27

The sequence controller 31 is also configured to give raw data to the computer 32. The raw data is complex number data obtained through the detection of a NMR signal and A/D conversion to the NMR signal detected in the receiver 30.

The transmitter 29 has a function to give a RF signal to the RF coil 24 in accordance with control information provided from the sequence controller 31. The receiver 30 has a function to generate raw data which is digitized complex number data by detecting a NMR signal given from the RF coil 24 and performing predetermined signal processing and A/D converting to the NMR signal detected. The receiver 30 also has a function to give the generated raw data to the sequence controller 31.

In addition, an ECG (electro cardiogram) unit 38 for acquiring an ECG signal of the object P is arranged in the vicinity of the object P. The ECG signal detected by the ECG unit 38 is outputted to the sequence controller 31. Thus, the sequence controller 31 is configured to send control signals synchronized with the ECG signal to the gradient power supply 27, the transmitter 29 and the receiver 30.

The computer 32 gets various functions by the operation unit 35 executing some programs stored in the storage unit 36 of the computer 32. The computer 32 may include some specific circuits instead of using some of the programs.

Figure 2:
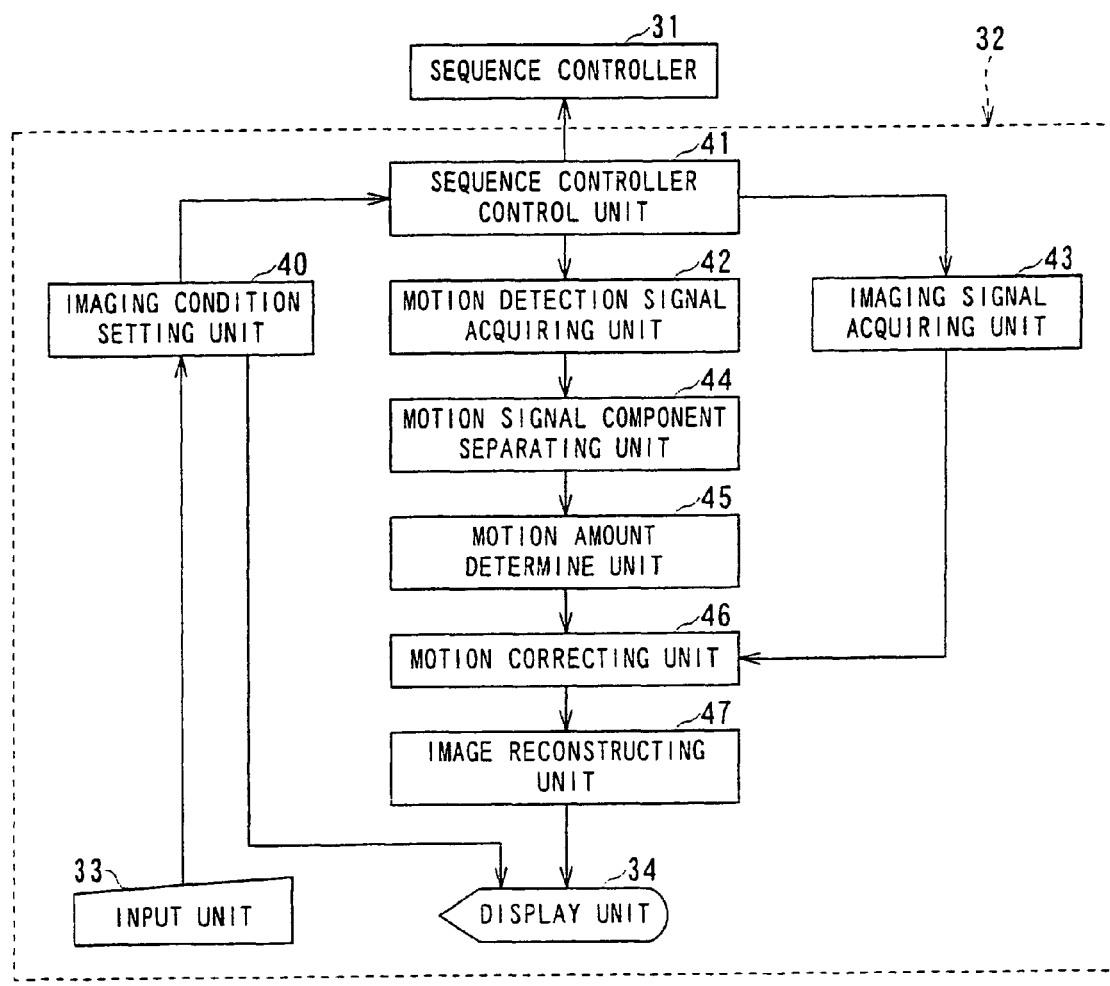
FIG. 2 is a functional block diagram of the computer shown in FIG. 1.

FIG. 2 is a functional block diagram of the computer 32 shown in FIG. 1.

The computer 32 functions as an imaging condition setting unit 40, a sequence controller control unit 41, a motion detection signal acquiring unit 42, an imaging signal acquiring unit 43, a motion signal component separating unit 44, a motion amount determine unit 45, a motion correcting unit 46 and an image reconstructing unit 47 by program as shown in FIG. 2. Thus, these elements give a function to acquire an NMR signal for detecting motion as well as that for imaging an object P and reconstruct an image with motion correction based on motion information detected from NMR signals for detecting motion to the magnetic resonance imaging apparatus 20.

The imaging condition setting unit 40 has a function to provide the display unit 34 with image information to display an imaging condition setting screen for setting an imaging condition on the display unit 34 and also a function of generating a pulse sequence as the imaging condition on the basis of information from the input unit 33. For the display of the imaging condition setting screen and the input of the information, GUI (Graphical User Interface) technique can be used. In addition, the imaging condition setting unit 40 is configured to supply the thus generated pulse sequence to the sequence controller control unit 41.

Figure 3:
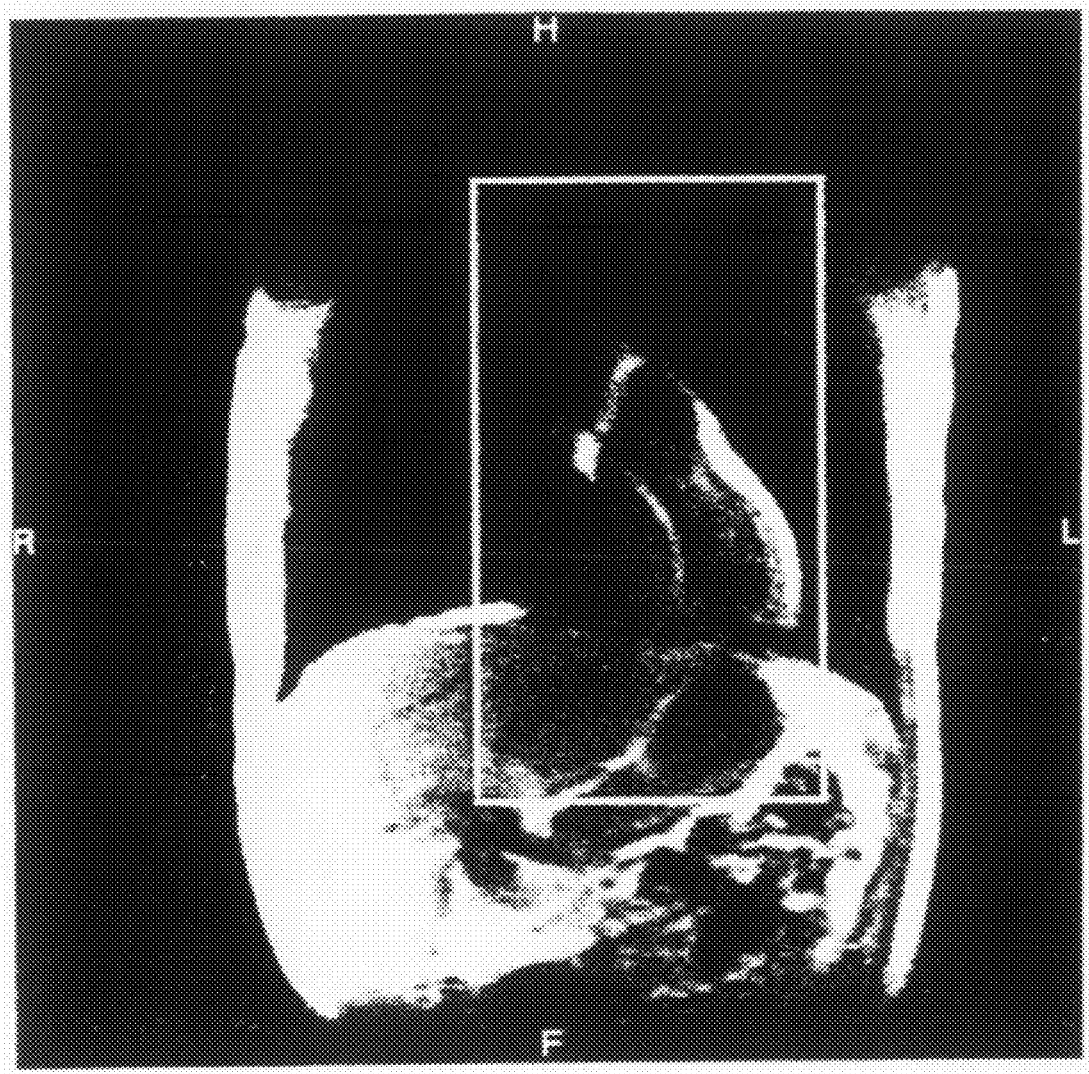
FIG. 3 is a diagram showing an example of imaging area set by the imaging condition setting unit shown in FIG. 2.

FIG. 3 is a diagram showing an example of imaging area set by the imaging condition setting unit 40 shown in FIG. 2.

As shown in FIG. 3, an area including the heart is set as the collection area for the NMR signals for the imaging (imaging area), for example, and it is possible to set an imaging condition for imaging the blood image of the heart. In addition, an area for collecting the NMR signals (motion signals) for detecting the motion of the heart is also set as the area including the heart. FIG. 3 shows an example in which the collection area for the NMR signals for the imaging and the collection area for the motion signals are set identical to each other, that is, an example in which the NMR signals for the imaging and the motion signals is collected from the same excitation area.

It should be noted that the collection area for the NMR signals for the imaging can be arbitrarily set and the collection area for the motion signals is set as the area where the motion signals can be collected from body parts and organs that are the motion detection target directly.

Figure 4:
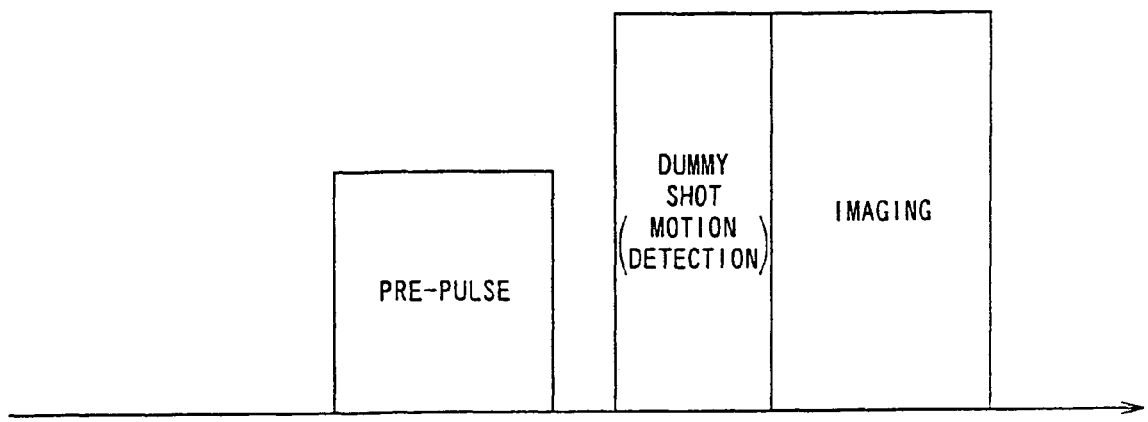
FIG. 4 is a diagram showing an example of pulse sequence produced for imaging the imaging area including the heart shown in FIG. 3.

FIG. 4 is a diagram showing an example of pulse sequence produced for imaging the imaging area including the heart shown in FIG. 3.

As shown in FIG. 4, the pulse sequence generated by the imaging condition setting unit 40 is structured to provide a sequence for applying a pre-pulse such as a fat suppression pulse prior to the sequence of the data collection for the imaging. In addition, a sequence for applying dummy shots for acquiring data required for a post-processing on information and data necessary for the collection of the data for the imaging is produced. The sequence for the dummy shots is set close to the sequence for the imaging in view of time. In FIG. 4, the sequence for the dummy shots is set at the start of the data collection for the imaging. It should be noted that the sequence is produced such that the area to be applied with the dummy shots becomes the area where the motion signals can be collected directly from the organ that is the motion detection target.

The slice direction of the dummy shots (cross-sectional direction of the excitation slab) can be set as an arbitral surface such as an axial surface, a sagittal surface, a coronal surface, and another oblique cross-section, and if the slice direction is set to a direction in which the motion is large, it is possible to detect the motion with further smaller amount of data at an improved accuracy. Therefore, it is possible to reduce the data collection time for the motion signals. Thus, a readout (RO) direction (frequency encode direction) is desirably set to a body axis direction of the object P.

Figure 5:
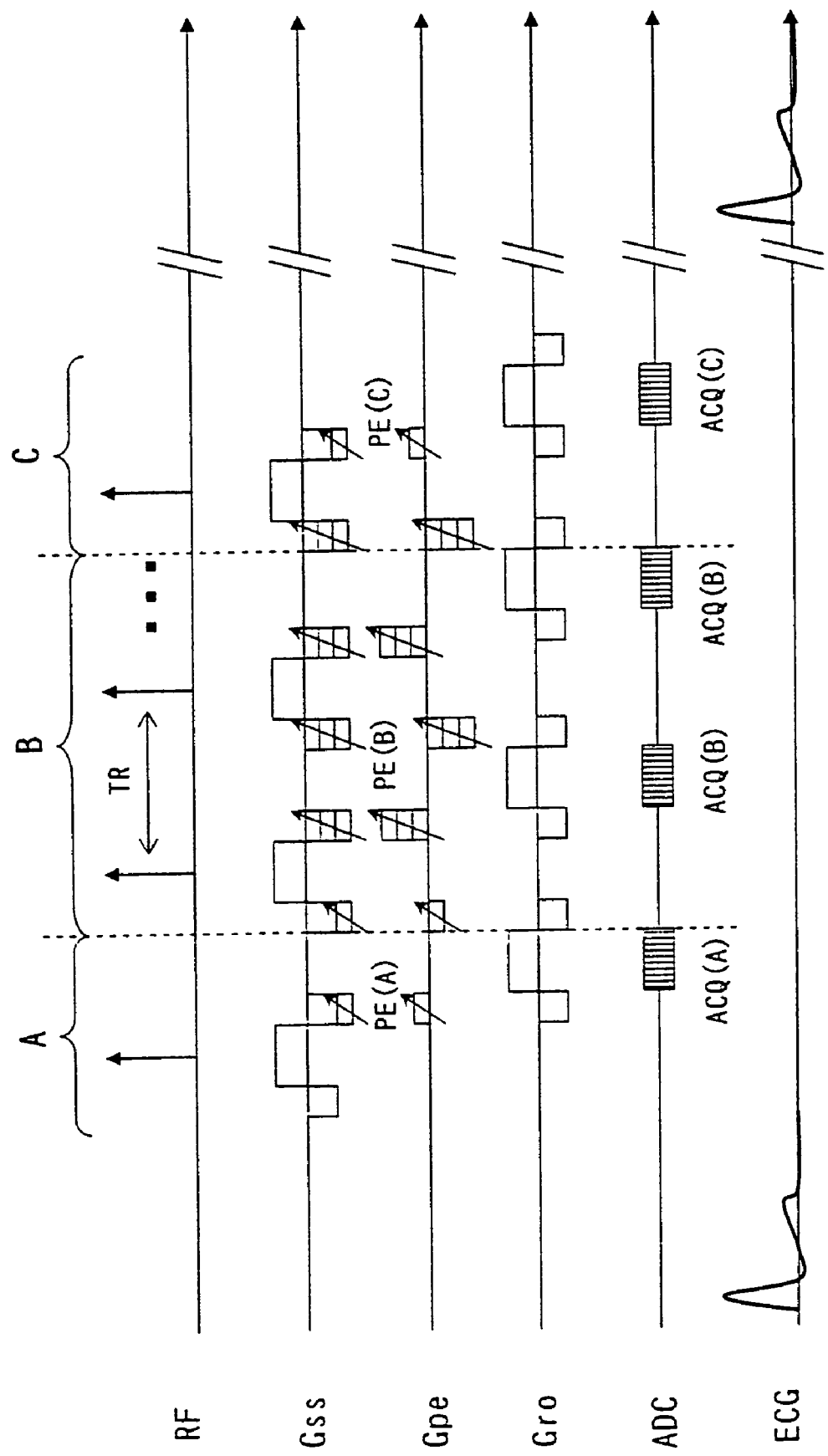
FIG. 5 is a diagram showing a specific example of the pulse sequence shown in FIG. 4.

FIG. 5 is a diagram showing a specific example of the pulse sequence shown in FIG. 4.

In FIG. 5, RF denotes a radio frequency (RF) signal, Gss denotes a gradient magnetic field pulse for slice selection, that is, in a slice encode (SE) direction, Gpe denotes a gradient magnetic field pulse in a phase encode (PE) direction, Gro denotes a gradient magnetic field pulse in a readout direction, ADC denotes a digitalized reception signal (ACQ), and ECG denotes an ECG signal. It should be noted that the encode direction herein refers to two axes at right angles to the readout direction.

As shown in FIG. 5, the pulse sequence is structured, for example, by a part A, a part B and a part C. The part B is the sequence for the data signals for the imaging, and the part A and the part C are the sequence for the detection of the motion signals. Then, the slice direction in the dummy shots for collecting the motion signals and the slice direction for the data collection for the imaging are both set to the sagittal surface including the heart. It should be noted that only one of the part A and the part C may be set to the sequence for the detection of the motion signals. In addition, the pulse sequence may be set such that only one of or both of the part A and the part C are repeatedly performed.

That is, the motion signals can be corrected before or after the collection of the data signals for the imaging. It should be noted that if the motion signals are collected both before and after the collection of the data signals for the imaging, the number of time phases for collecting the motion signals can be increased. Then, the motion signal data changing over time through an interpolating process such as the interpolation or the extrapolation can be obtained. As a result, a higher accuracy of the motion signal data can be achieved.

The part A, the part B and the part C are all a sequence based on an imaging method called SSFP (Steady-State Free Precession), for example. According to SSFP, the RF signals are applied at an extremely short repetition time (TR) and the data collection can be executed. Thus, it can be said that a time difference between the part A and the part B and a time difference between the part B and the part C are sufficiently small. That is, if the data collection for the imaging and the collection of the motion signals are performed with a sequence in which TR is a small, it can be considered that the data collection timing for the imaging and the collection timing of the motion signals are at substantially the same time. Thus, it can be considered the motion during the data collection for the imaging and the motion during the collection of the motion signals are sufficiently the same.

The part A, the part B and the part C are sequences for the electrocardiograph synchronous imaging to be repeatedly executed in synchronous with the ECG signals acquired by the ECG unit 38. The part B that is the sequence for the imaging collects a three dimensional imaging signals ACQ (B) by the readout pulse while sequentially changing a phase encode pulse PE (B), in other words, a sequence for the segment imaging. Thus, in one sequence for the imaging during one heart beat, partial data for the imaging is obtained. Then, the data collection for the imaging is repeatedly executed over a plurality of heart beats, and it is thus possible to collect all the data necessary for the imaging. That is, the data for the imaging is collected by performing the segment imaging by plural times over the plurality of heart beats.

On the other hand, the part A and the part C that are the sequences for the detection of the motion signals respectively collect motion detection signals ACQ (A) and ACQ (C) by the readout pulses while sequentially changing the phase encode pulses PE (A) and PE (C). The collection of the motion signals on the basis of the sequence for the detection of the motion signals (the part A and the part C in the example of the sequence shown in FIG. 5) is executed each time the segment imaging on the basis of the sequence for the imaging proceeds, that is, at every heart beat. Thus, all the motion signals of the necessary amount of encoding are collected each time by the corresponding sequence for the detection of the motion signals at every heart beat. Therefore, the motion signals from the same area are acquired over plural times at different timings intermittently. Thus, the collected motion signals contain more accurate information on the breathing motion. Accordingly, it is possible to find out the amount of motion from the motion signals obtained from the same area at different timings more precisely.

In addition, in the sequence for the detection of the motion signals, the amount of phase encode (the number of steps of the phase encode) is set smaller than the sequence for the imaging so that the necessary motion signals can be selectively collected at a shorter period of time. It should be noted that in the amount of phase encode in the sequence for the detection of the motion signals is not zero. Furthermore, the sequence is set such that information that is the original collection target of the dummy shots can be obtained under the imaging condition.

For example, in the dummy shot, a sequence is set so that a 45° RF pulse is applied and accordingly a signal can be obtained at a certain contrast. Then the sequence for the imaging is set so that a 90° RF pulse is applied and accordingly the data collection for the imaging is performed at a contrast determined on the basis of the contrast of the signals collected in the dummy shot.

In addition, the encode directions in the sequence for the detection of the motion signals are not limited to biaxial directions of the slice encode direction and the phase encode direction, and the encode direction may be a single-axis direction of one of the slice encode direction and the phase encode direction.

Then, the imaging condition setting unit 40 is configured to display the imaging condition setting screen for setting such an imaging condition on the display unit 34 so that the user can generate the pulse sequence as the imaging condition through the input unit 33.

Figure 6:
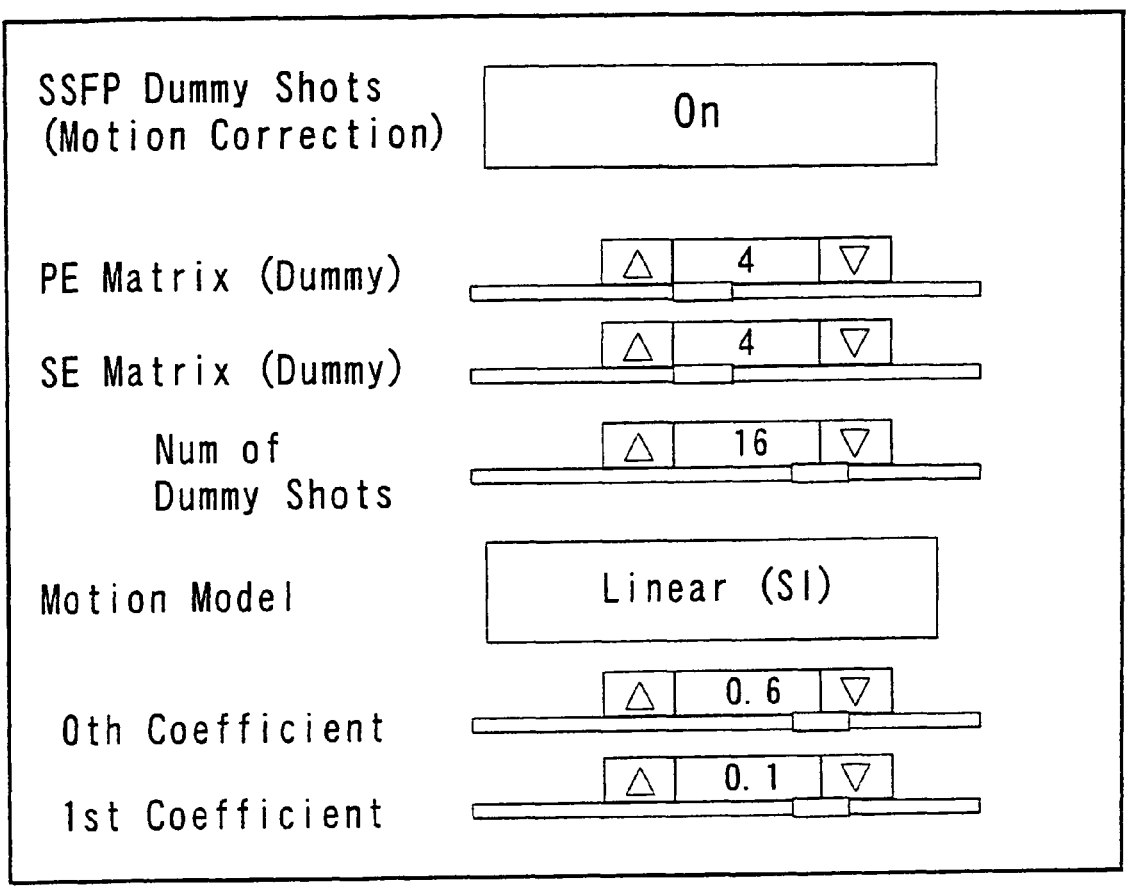
FIG. 6 is a diagram showing an example of imaging condition setting screen displayed on the display unit shown in FIG. 1.

FIG. 6 is a diagram showing an example of imaging condition setting screen displayed on the display unit 34 shown in FIG. 1.

As shown in the upper part of the imaging condition setting screen in FIG. 6, in the dummy shots of the SSFP sequence, a button for switching On/Off of a function for collecting the motion signals and executing the motion correction is displayed. When this button is clicked by way of the operation of the input unit 33 such as a mouse, the motion correction function based on the motion signals collected in the dummy shots is put into an on state.

Furthermore, the number of the phase encodes (PE Matrix), the number of slice encodes (SE Matrix) and the number of dummy shots (Num of Dummy Shot) in the dummy shots can be arbitrarily set with the operation such as scrolling of a scroll bar.

Moreover, a Linear (SI) button for specifying a motion model to be used for the motion correction is provided at the lower part of the imaging condition setting screen. When the Linear (SI) button is clicked, a correction mode is selected for executing the motion correction on the basis of the motion model in which it is assumed that the area serving as the detection target of the amount of motion is linearly deformed due to the motion. Then, a zero-order coefficient and a first order of linear expression representing the linear motion model can be arbitrarily set through the operation such as scrolling of the scroll bar. The detail of the motion model will be described later.

Incidentally, the phase encode pulses included in the dummy shots for detecting the motion signals generate an eddy current. The phase encode pulses are applied by plural times intermittently with different surfaces and polarities in usual cases. Therefore, vibration of the magnetization is generated due to the thus generated eddy current. Therefore, there is a fear that the vibration of the magnetization generated due to the dummy shots gives an influence on the data collection for the imaging and a ghost may occur on a reconstructed image.

In view of the above, by setting such a pulse sequence that the vibration of the magnetization generated due to the dummy shots is reduced and that the influence of the vibration of the magnetization is reduced as much as possible with respect to the data collection for the imaging, the occurrence of a ghost can be suppressed. For that reason, it is desired to set such a sequence that the vibration of the magnetization generated due to the dummy shots is gradually reduced. In addition, it is also desired to set such a sequence that the amount of step (difference in pulse intensities) between the last phase encode pulse in the dummy shots and the following first phase encode pulse for the imaging is as small as possible.

Figure 7:
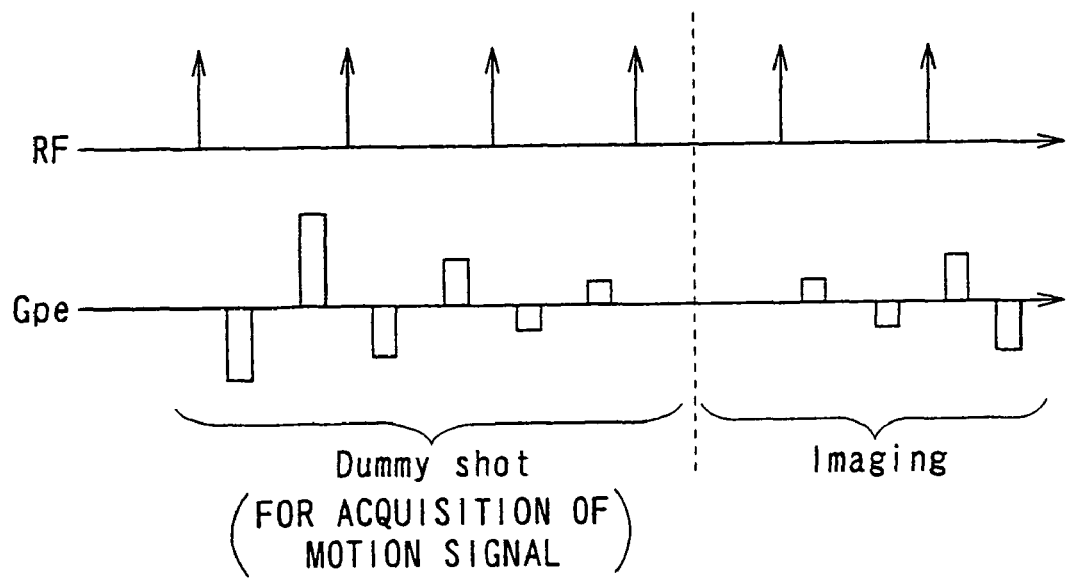
FIG. 7 is a diagram showing a specific example of pulse sequence set for reducing influence of vibration of magnetization occurred due to a dummy shot and magnetization to data acquisition for imaging by the imaging condition setting unit shown in FIG. 2.

FIG. 7 is a diagram showing a specific example of pulse sequence set for reducing influence of vibration of magnetization occurred due to a dummy shot and magnetization to data acquisition for imaging by the imaging condition setting unit 40 shown in FIG. 2.

As shown in FIG. 7, a description will be given of a case where the sequence for the imaging is set following the sequence for the dummy shot for collecting the motion signals. It should be noted that RF denotes an RF signal and Gpe denotes a phase encode pulse.

First of all, the step direction (application direction) of the phase encode pulse for detecting the motion signals is set identical to the step direction of the phase encode pulse for the imaging. Then, the sequence for the dummy shots is set so that the phase encode pulse for detecting the motion signals alternately changes its polarity over a period of time and gradually reduces its pulse intensity. As a result, the vibration of the magnetization generated due to the dummy shots can be smoothly reduced.

In addition, the sequence for the imaging is set such that the polarity of the last phase encode pulse in the dummy shots is the same as the polarity of the first phase encode pulse for imaging and the amount of step (difference between the pulse intensities Gpe) of the phase encode pulses is reduced as much as possible. As a result, the influence of the vibration of the magnetization generated due to the dummy shots on the data collection for the imaging can be suppressed. In addition, in the data collection for the imaging as well, in order to smooth the vibration of the magnetization, the sequence is preferably set such that the pulse intensity is gradually increased while the polarities are alternately changed over the elapse of time.

Therefore, such a pulse sequence is optimal that the polarities of the phase encode pulses in the dummy shots are opposed to the polarities of the phase encode pulses for the imaging and the order of the application positions (data collection positions) of the phase encode pulses in the dummy shots is opposite to the order of the application positions of the phase encode pulses for the imaging. Then, when the imaging condition setting unit 40 is configured to set such a pulse sequence, it is possible to reduce the eddy current and the changes in magnetization to obtain an image with a stable image quality.

In addition, the imaging condition setting unit 40 is configured to supply the thus generated pulse sequence to the sequence controller control unit 41.

The sequence controller control unit 41 has a function of performing a drive control of the sequence controller 31 by supplying the pulse sequence acquired from the imaging condition setting unit 40 to the sequence controller 31 on the basis of the imaging start instruction from the input unit 33 and a function of receiving the motion signals from the sequence controller 31 to supply the motion signals to the motion signal acquisition unit 42 as well as receiving raw data for the imaging from the sequence controller 31 to supply the raw data to the imaging signal acquisition unit 43.

The motion signal acquisition unit 42 has a function of acquiring the motion signals from the sequence controller control unit 41 and a function of arranging the thus acquired motion signals in a k space (a wave number space or a frequency space) provided to the motion signal acquisition unit 42.

The imaging signal acquisition unit 43 has a function of acquiring the raw data for the imaging from the sequence controller control unit 41 as the imaging signal and a function of arranging the thus acquired imaging signal in the k space provided to the imaging signal acquisition unit 43.

Figure 8:
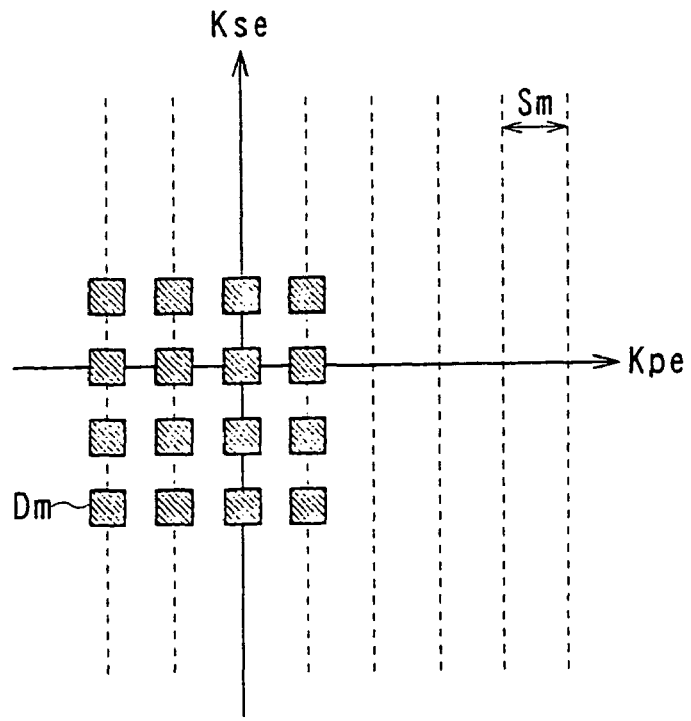
FIG. 8 is a diagram showing an example of motion signals arranged in the k-space in the motion detection signal acquiring unit shown in FIG. 2.
Figure 9:
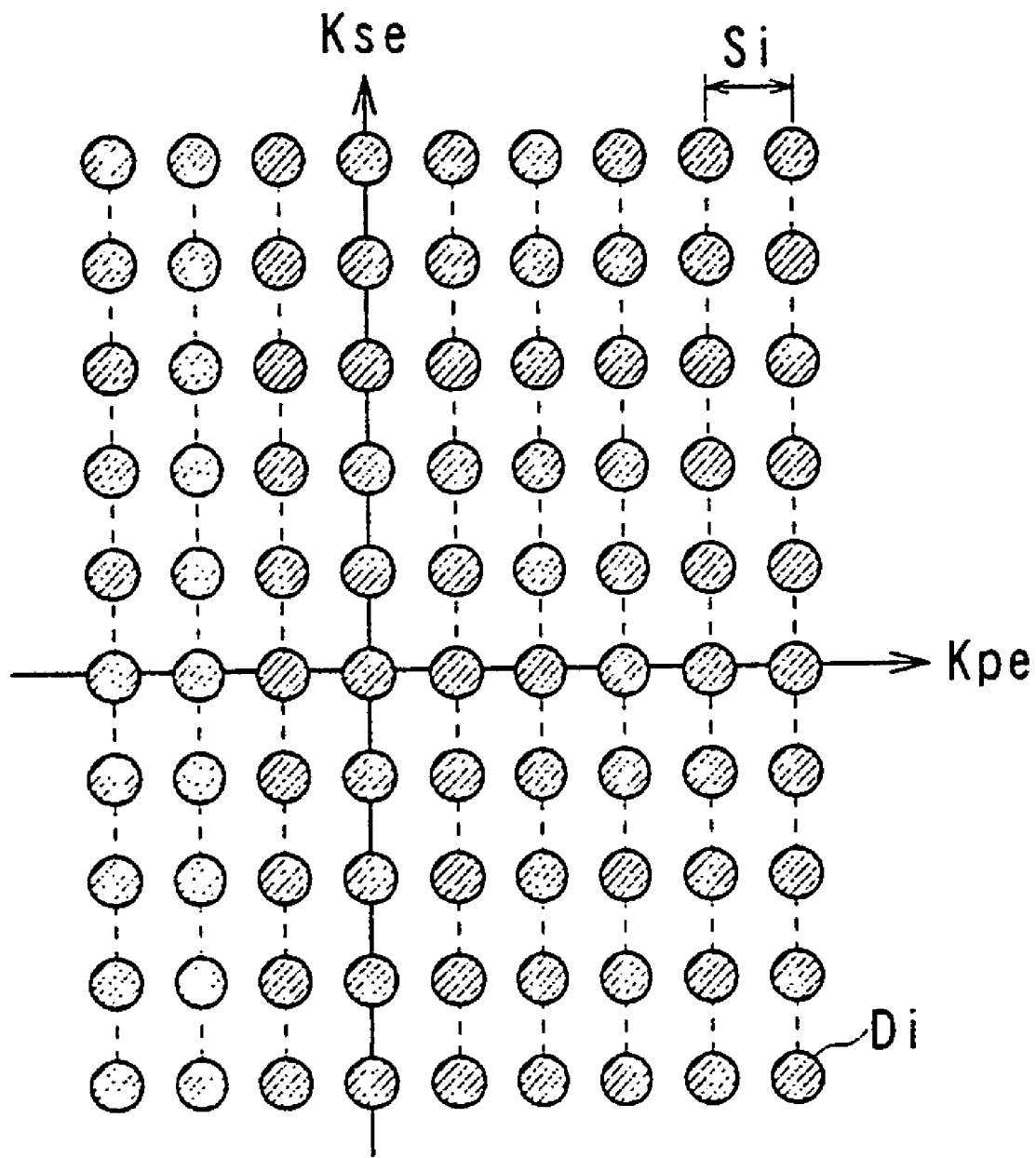
FIG. 9 is a diagram showing an example of imaging signals arranged in the k-space in the imaging signal acquiring unit shown in FIG. 2.

FIG. 8 is a diagram showing an example of motion signals arranged in the k-space in the motion detection signal acquiring unit 42 shown in FIG. 2. FIG. 9 is a diagram showing an example of imaging signals arranged in the k-space in the imaging signal acquiring unit 43 shown in FIG. 2.

The horizontal axis of each of FIG. 8 and FIG. 9 represents the phase encode direction Kpe in the k space and the vertical axis thereof represents the slice encode direction Kse. In addition, a squire mark in FIG. 8 represents a motion signal Dm and a circle mark in FIG. 9 represents an imaging signal Di. As shown in FIG. 8, in the dummy shots, the encode pulse is also applied to collect the motion signal Dm.

As has been described above, the motion signal Dm is collected at every heart beat and is data to be updated. FIG. 8 shows an example of the motion signal Dm obtained by applying the encode pulses to the two axial directions of the phase encode direction and the slice encode direction. As has been described above the motion signal Dm may be collected by applying the encode pulse in one axis direction. The motion signal Dm is collected at the part A and the part C in case of using the pulse sequence shown in FIG. 5.

Also, the imaging signal Di shown in FIG. 9 is collected at the part B in case of using the pulse sequence shown in FIG. 5. As the imaging signals Di are collected through the segment imaging, the imaging signals Di are partially obtained by one sequence in one heart beat. Then, the plural times of data collection by plural sequences performed over a plurality of heart beats realizes the collection of all the imaging signals Di.

In addition, as has been described above, the amount of encode for the motion signals Dm, to be more precise, the number of steps is set smaller than the number of steps for the imaging signals Di. On the other hand, the amount of step Sm for the motion signals Dm may be the same as or different from the amount of step Si for the imaging signals Di. It should be noted that in order to detect the motion of larger organs with a high precision, the motion signals Dm in the vicinity of the center of the k space are collected with priority.

It should be noted that, when the motion signals Dm and the imaging signals Di are collected so as to suppress the vibration of the magnetization and its influence, the position of the last collected motion signal Dm by the dummy shot on the k space is set close to the center of the k space and the position of the following first imaging signal Di for the imaging on the k space is set close to the position in k space of the last collected motion signal Dm by the dummy shot as much as possible. In addition, the collecting direction of the motion signals Dm and the collecting direction of the imaging signals Di are set opposite to each other.

A motion signal component separation unit 44 has a function of reading the motion signals from the motion signal acquisition unit 42 and separating from each other a signal composition in which a motion is generally reflected and a signal composition in which the motion is not reflected and a function of supplying the signal composition in which the motion is reflected (motion reflected component), which is obtained through the separation, to the motion amount determine unit 45. The motion signal component separation unit 44 is configured to perform reconstruction on the motion signals through a known reconstruction method (Fourier transform) for the separation of the motion signals and obtain profile data on a specific space position (in the encode direction).

Figure 10:
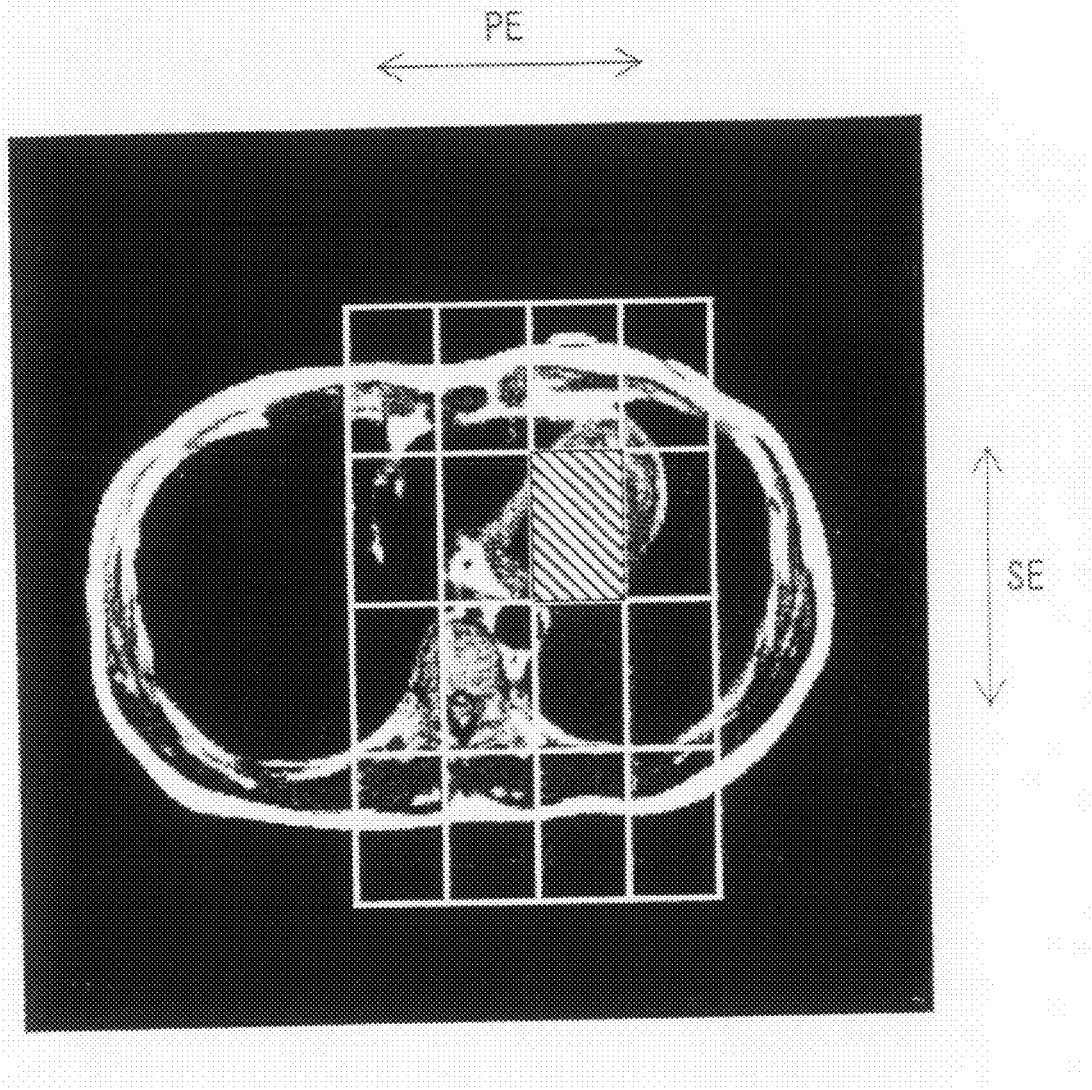
FIG. 10 is a diagram showing an area of the motion signals separated by the motion signal component separating unit shown in FIG. 2.

FIG. 10 is a diagram showing an area of the motion signals separated by the motion signal component separating unit 44 shown in FIG. 2.

As shown in FIG. 10, for example, the motion signals are collected while the sagittal surface including the heart is taken as the excitation slab, the right and left direction is set as the phase encode (PE) direction, the up and down direction is set as the slice encode (SE) direction, and the body axis direction of the object P which is perpendicular to the paper surface is set as the readout direction. That is, as has been described above, in order to reduce the data collection time, the body axis direction where the amount of motion is relatively large is set as the readout direction. Therefore, the excitation slab may be the coronal surface.

When the motion signals are collected while 4×4 of the encode pulses are added in the PE direction and the SE direction and the collected motion signals are reconstructed, the profiles in the body axis direction divided in the areas of 4×4 can be obtained. Then, it is possible to select only a profile showing the breathing motion in an area in the vicinity of the heart (shaded area) among the profiles as the motion reflected component.

One example of a method of selecting the profile showing the motion is a method of selecting a profile of a part in which distortion amount of the reconstructed image data is considerably large. In this case, all the profiles are compared with each other and a profile having the change in the signal intensity exceeding a previously set threshold can be set as the motion reflected component. It should be noted that it is possible to easily select the profile showing the motion with such a method in which an area expected to have the breathing motion empirically is designated in advance and merely a profile of the designated area is set as the motion reflected component.

Figure 11:
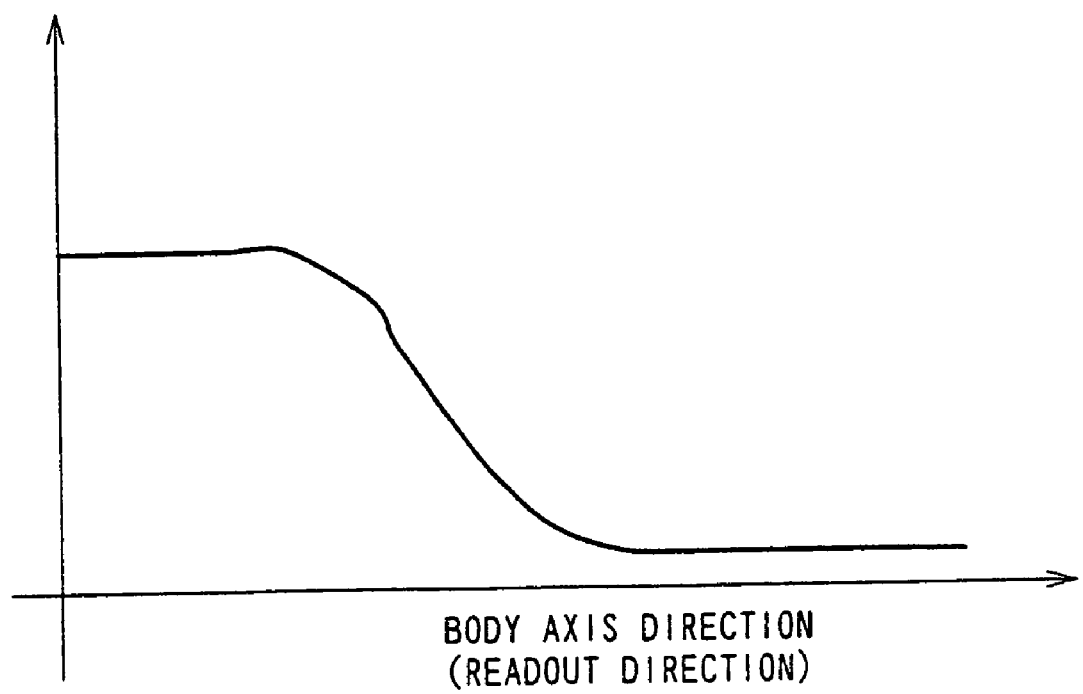
FIG. 11 is a diagram showing an example of profile corresponding to the area near the heart shown in FIG. 10.

FIG. 11 is a diagram showing an example of profile corresponding to the area near the heart shown in FIG. 10.

In FIG. 11, the horizontal axis represents a position in the readout direction (body axis direction) and the horizontal axis represents the signal intensity of the motion signal. Then, the solid line in FIG. 11 is a profile selected as the motion reflected component. The collection of the motion signals is executed each time the segment imaging described above is advanced and therefore the motion reflected component shown in FIG. 11 is also acquired each time the segment imaging proceeds. Then, as the segment imaging is the electrocardiograph synchronous imaging, the motion reflected component can be regarded as intermittently acquired information on the breathing motion.

Then, the motion reflected component extracted by the motion signal component separation unit 44 is supplied to the motion amount determine unit 45.

The motion amount determine unit 45 has a function of determining the amount of motion on the basis of the motion reflected component received from the motion signal component separation unit 44 and a function of supplying the determined amount of motion to the motion correcting unit 46.

Figure 12:
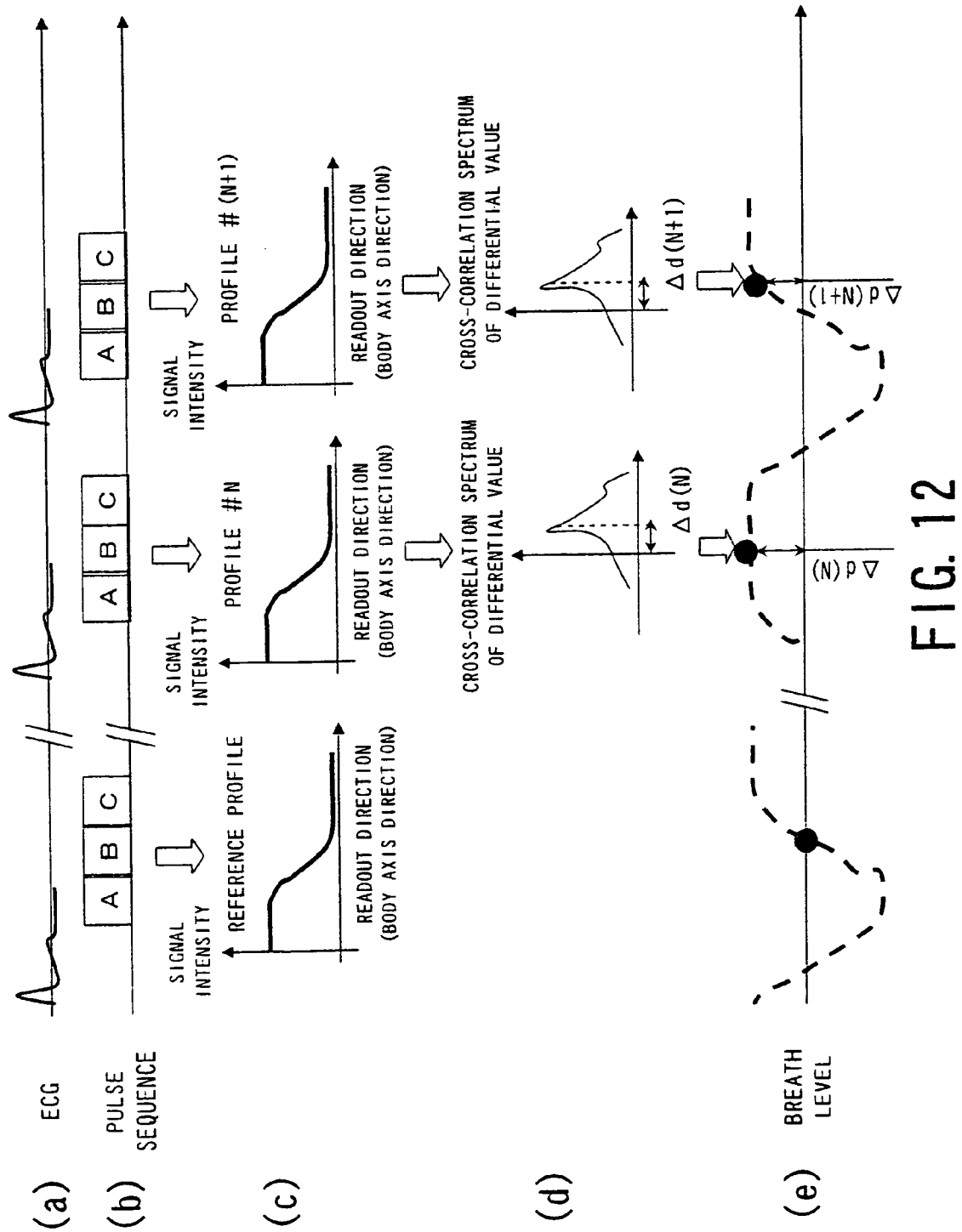
FIG. 12 is a diagram explaining a method for determining a motion amount by the motion amount determine unit shown in FIG. 2.

FIG. 12 is a diagram explaining a method for determining a motion amount by the motion amount determine unit 45 shown in FIG. 2.

As shown in the upper part of FIG. 12, the data collection for creating the reference profile of the motion reflected component is performed in advance. In the data collection for creating the reference profile, in synchronism with the ECG signal shown in FIG. 12($a$), on the basis of the pulse sequence having the part A, the part B and the part C shown in FIG. 12($b$) as the element parts, the motion signals serving as the reference are collected together with the data collection for the imaging. Then, the motion signal component separation unit 44 sets a profile of the motion reflected component shown in FIG. 12($c$) as the reference profile among the collected motion signals.

Then, at the time of the imaging, in synchronism with the ECG signal shown in FIG. 12($a$), on the basis of the pulse sequence having the part A, the part B and the part C shown in FIG. 12($b$) as element parts, the motion signals and the data for the imaging are collected over a plurality of times. Then, a profile #N of the n-th collected motion reflected component shown in FIG. 12($c$) and a profile #N+1 of the (N+1)-th collected motion reflected component are sequentially obtained by the motion signal component separation unit 44.

The reference profile of the motion reflected component, the profile #N and the profile #N+1 are supplied from the motion signal component separation unit 44 to the motion amount determine unit 45. As a result, the motion amount determine unit 45 obtains a cross-correlation spectrum between a differential value of the reference profile shown in FIG. 12($d$) and a differential value of the profile #N and a cross-correlation spectrum between a differential value of the reference profile and a differential value of the profile #N+1. Then, the motion amount determine unit 45 detects the peak position of each of the cross-correlation spectra and determines the detected relative amounts $\Delta d$ (N) and $\Delta d$ (N+1) of positional shifts at the respective peak positions as the amounts of motion at the N-th data collection and the N+1-th data collection.

When the amounts of motion $\Delta d$ (N) and $\Delta d$ (N+1) respectively determined by the motion amount determine unit 45 are represented on data (dotted line) indicating the breath level shown in FIG. 12(e), the amounts are shown like circle marks. Then, such a configuration is adopted that the amounts of motion determined in this manner are supplied from the motion amount determine unit 45 to the motion correcting unit 46.

The motion correcting unit 46 has a function of acquiring the amount of motion from the motion amount determine unit 45 and also acquiring the imaging signal from the imaging signal acquisition unit 43 to correct the imaging signal on the basis of the amount of motion and a function of supplying the imaging signal after the correction to the image reconstructing unit 47.

Figure 13:
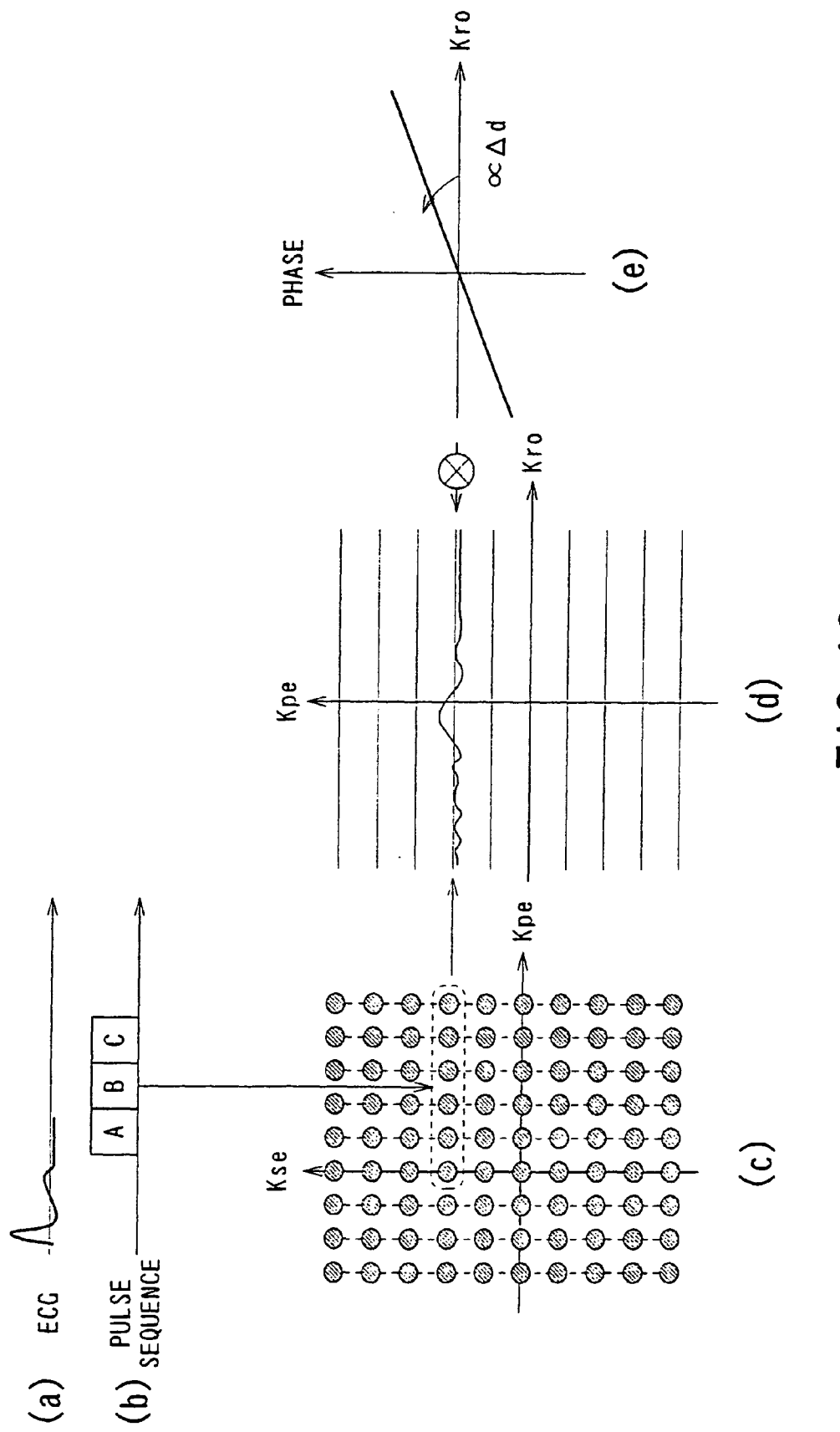
FIG. 13 is a diagram explaining a method for correcting imaging signals by the motion correcting unit shown in FIG. 2.

FIG. 13 is a diagram explaining a method for correcting imaging signals by the motion correcting unit 46 shown in FIG. 2.

First of all, a description will be given to a case in which the parallel motion of the target area in the readout direction is corrected. As shown in FIG. 13(a), the data collection by the pulse sequence having the part A, the part B and the part C shown in FIG. 13(b) is performed while the ECG signal is used in synchronism with the cardiac electrogram. In the part B, the imaging signals are collected by way of the segment imaging, and as shown in FIG. 13(c) and are subjected to mapping to the k space formed in the imaging signal acquisition unit 43. By the one time segment imaging in the part B, for example, as shown in FIG. 13(c), the imaging signals surrounded by the dotted line are collected to be arranged at predetermined positions in the k space.

Then, the distribution of the imaging signals collected through a certain segment imaging in the readout direction and the phase encode direction is such a distribution shown in FIG. 13(d).

On the other hand, when the amount of motion calculated from the motion signals collected at the substantially same time as the imaging signals is $\Delta d$, the motion correcting unit 46 creates a phase shift function shown by the solid line of FIG. 13(e). In FIG. 13(e), the vertical axis represents a phase and the horizontal axis represents a position Kro in the readout direction. That is, the motion correcting unit 46 creates the phase shift function having a first order distribution in which the phase in the readout direction is proportional to the amount of motion $\Delta d$.

Then, the motion correcting unit 46 multiplies the imaging signals in the readout direction by the phase shift function. It should be noted that when the motion signal is the motion signal for the reference profile, it may be accepted to assume that the amount of motion $\Delta d$ is 0. This calculation can be represented as such a conversion as shown in Expression (1) when the imaging signal in the position (Kro, Kpe, Kse) on the k space is S(Kro, Kpe, Kse).

$$S(Kro, Kpe, Kse) \rightarrow S(Kro, Kpe, Kse) \cdot \exp(-\Delta d \cdot Kro) \quad (1)$$

In this way, the motion correction can be performed on the imaging signal in terms of the parallel motion in the readout direction. Furthermore, the correction can also be performed on the imaging signal in terms of not only the parallel movement but also the linear expansion and contraction.

When the linear motion of a certain point z along with the expansion and contraction in the readout direction is described as Expression (2-1) with use of a first order coefficient $\alpha$ and the zero-th order coefficient $\beta$, the motion of the imaging signal S on the k space is represented by Expression (2-2).

$$Z \rightarrow (1+\alpha)Z + \beta \quad (2-1)$$

$$S(Kro, Kpe, Kse) \rightarrow S((1+\alpha)Kro, Kpe, Kse) \cdot \exp(-\beta Kro) \quad (2-2)$$

From Expression (2-2), it is understood that when the linear expansion and contraction motion exists, the sampling position in the readout direction is moved by a given ratio $\alpha$ as compared with a case in which there is no motion due to the expansion and contraction. Thus, the correction on the expansion and contraction is accordingly performed by obtaining the imaging signal S(Kro, Kpe, Kse) in the original sampling position (Kro, Kpe, Kse) from the imaging signal S((1+$\alpha$)Kro, Kpe, Kse) which is moved by the given ratio $\alpha$. The imaging signal S(Kro, Kpe, Kse) in the original sampling position (Kro, Kpe, Kse) can be found out through the interpolating process in which the imaging signal S((1+$\alpha$)Kro, Kpe, Kse) which is moved by the given ratio $\alpha$ is used.

Then, the values of $\alpha$ and $\beta$ in Expression (2-1) can be determined from the first order linear deformation motion model in which the values of $\alpha$ and $\beta$ change depending on the amount of motion $\Delta d$. The coefficient of the motion model can be obtained through actual measurement (actual imaging). In the imaging condition setting screen shown in FIG. 6, the determined values of $\alpha$ and $\beta$ can be arbitrarily set as the first order coefficient and the zero-th order coefficient of the first order expression representing the linear deformation by way of the operation of the Linear (SI) button for instructing the motion correction in accordance with the motion model of the linear deformation along with the expansion and contraction.

Then, not only the correction on the expansion and contraction but also the correction on the parallel movement on the basis of the value of $\beta$ can be executed by the phase calculation shown in Expression (1). In this way, the correction on the expansion and contraction and the parallel movement due to motion can be conducted with respect to the imaging signal. Then, the imaging signal after the correction is supplied from the motion correcting unit 46 to the image reconstructing unit 47.

The image reconstructing unit 47 has a function of creating the image data of the object P that is the real spatial data by performing the image reconstruction processing such as the two dimensional or three dimensional Fourier transform processing on the imaging signal after the correction received from the motion correcting unit 46 and a function of performing a necessary image processing on the created image data to be supplied to the display unit 34. Examples of the image processing include an MIP (Maximum Intensity Projection) processing.

Next, a description will be made of the operation and action of a magnetic resonance imaging apparatus 20.

Figure 14:
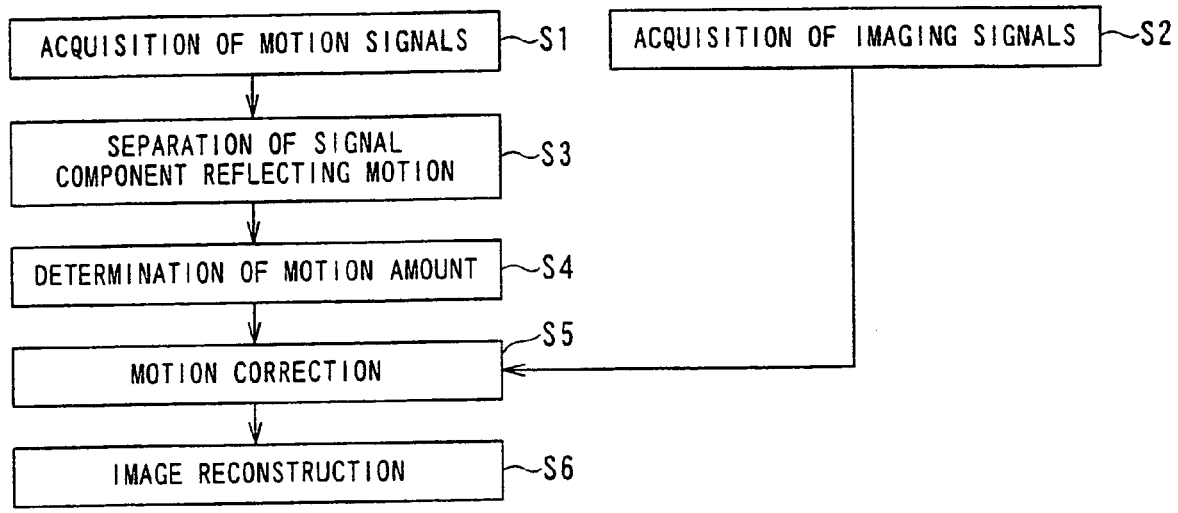
FIG. 14 is a flowchart showing a procedure for imaging a vascular image of the heart of the object with the magnetic resonance imaging apparatus shown in FIG. 1.

FIG. 14 is a flowchart showing a procedure for imaging a vascular image of the heart of the object P with the magnetic resonance imaging apparatus 20 shown in FIG. 1. The symbols including S with a number in FIG. 14 indicate each step of the flowchart.

In Step S1, the motion signals are acquired from the area that is the detection target of the amount of motion included in the imaging slab. In addition, in Step S2 performed nearly at the same time as Step S1, the NMR signals for the imaging (the imaging signals) are acquired from the imaging slab including the target area for the imaging. This acquisition of the imaging signals is executed at a timing extremely close in terms of time to the acquisition of the motion signals.

For that reason, when the imaging condition setting unit 40 previously supplies the screen information to the display unit 34, the imaging condition setting screen shown in FIG. 6 is displayed on the display unit 34. When the user turns on the motion correction function through the operation on the input unit 33 and sets various correction conditions, the imaging condition setting unit 40 sets an excitation slab shown in FIG.

3 on the basis of the set imaging condition and generates the pulse sequence shown in FIG. 4 and FIG. 5 or FIG. 7. Then, the imaging condition setting unit 40 supplies the thus generated pulse sequence to the sequence controller control unit 41.

The sequence controller control unit 41 supplies, on the basis of the imaging start instruction from the input unit 33, the pulse sequence acquired from the imaging condition setting unit 40 to the sequence controller 31. As a result, the sequence controller 31 supplies, on the basis of the pulse sequence, the control pulses to the gradient power supply 27, the transmitter 29 and the receiver 30 respectively. Therefore, currents are supplied from the X-axis gradient power supply 27x, the Y-axis gradient power supply 27y and the Z-axis gradient power supply 27z of the gradient power supply 27 to the X-axis gradient coil 23x, the y-axis gradient coil 23y and the Z-axis gradient coil 23z respectively, whereby a gradient magnetic field Gx in the X-axis direction, a gradient magnetic field Gy in the Y-axis direction and a gradient magnetic field Gz in the Z-axis direction are formed in the imaging area. In addition, the RF signal is supplied from the transmitter 29 to the RF coil 24 and the RF coil 24 transmits the RF signal to the object P.

Then, the NMR signal generated by a nuclear magnetic resonance of a nuclear spin inside the object P is received by the RF coil 24 to be supplied to the receiver 30. The receiver 30 generates raw data through a predetermined signal processing such as the detection and A/D conversion of the NMR signal and supplies the thus generated raw data to the sequence controller 31.

Herein, the sequence for the collection of the motion signals is set in the pulse sequence prior to the data collection for the imaging, and therefore not only the raw data used as the imaging signal but also the motion signal are supplied to the sequence controller 31. The sequence controller 31 supplies the collected imaging signal and the motion signal to the sequence controller control unit 41.

Then, the motion signal acquisition unit 42 acquires the motion signals from the sequence controller control unit 41 and arranges the acquired motion signals in the k space formed within the motion signal acquisition unit 42. In addition, the imaging signal acquisition unit 43 acquires the image signals from the sequence controller control unit 41 and arranges the acquired imaging signals in the k space formed within the imaging signal acquisition unit 43.

It should be noted that the collection of the imaging signals and the motion signals is performed under the electrocardiograph synchronism on the basis of the ECG signals acquired by the ECG unit 38 and the pulse sequence.

Next, in Step S3, the motion signal component separation unit 44 reads the motion signals from the motion signal acquisition unit 42 and separates the motion signals into the signal component in which the motion is generally reflected and the signal component in which the motion is not reflected. For that reason, the motion signal component separation unit 44 executes the image reconstruction processing of the motion signals and obtains the profile data in the encode direction in the plurality of divided areas of which number is depending to encoding amount shown in FIG. 10. Then, the motion signal component separation unit 44 compares, for example, the profile data to each other in all the areas, and separates a profile having the largest change as the motion reflected component. The motion reflected component obtained by the motion signal component separation unit 44 shown in FIG. 11 is supplied to the motion amount determine unit 45.

Next, in Step S4, the motion amount determine unit 45 determines the amount of motion on the basis of the motion reflected component received from the motion signal component separation unit 44. To be more specific, through a procedure shown in FIG. 12, a reference profile is determined and the cross-correlation spectrum between a differential value of the reference profile and a differential value of the profile at the timing corresponding to the calculation target of the amount of motion. Then, the amount of positional shift in the peak of the cross-correlation spectrum is calculated as the amount of motion. The motion amount determine unit 45 then supplies the thus determined amount of motion to the motion correcting unit 46.

Next, in Step S5, the motion correcting unit 46 obtains the amount of motion from the motion amount determine unit 45 and also obtains the imaging signals from the imaging signal acquisition unit 43 to correct the imaging signals on the basis of the amount of motion. For example, through a procedure shown in FIG. 13, the motion correcting unit 46 multiplies the phase shift function having the first order distribution in which the phase in the readout direction is in proportion to the amount of motion $\Delta d$ and the imaging signals in the readout direction. That is, with the conversion shown in Expression (1), the motion correcting unit 46 executes the motion correction on the parallel movement with respect to the imaging signals.

Also, for example, in the imaging condition setting screen shown in FIG. 6, when the Linear (SI) button is clicked and the correction on the expansion and contraction is also instructed, with the use of the zero-th order coefficient $\beta$ and the first order coefficient $\alpha$ of the first order expression representing the linear motion model, the correction on the expansion and contraction is also executed in addition to that on the parallel movement. The correction on the expansion and contraction with respect to the imaging signals can be performed through the interpolating processing while using the first order coefficient $\alpha$ on the basis of Expression (2-2).

Then, the motion correcting unit 46 supplies the imaging signals after the motion correction to the image reconstructing unit 47.

Next, in Step S6, the image reconstructing unit 47 performs the image reconstruction processing such as the two dimensional or three dimensional Fourier transform processing on the imaging signals after the correction which is received from the motion correcting unit 46 to create the image data of the object P that is the real spatial data. In addition, the image reconstructing unit 47 performs the image processing such as the MIP processing on the thus created image data to be supplied to the display unit 34. As a result, the image of the object P obtained by performing the motion correction with use of the motion signals acquired in the dummy shots is displayed on the display unit 34.

According to the magnetic resonance imaging apparatus 20 having the above-mentioned configuration, the motion signals are acquired in the dummy shots set so as to be close in terms of time to the sequence for the imaging, and therefore it can be considered that the detection timing for the motion signals and the timing for the collection of the data for the imaging are nearly simultaneous to each other. In addition, according to the magnetic resonance imaging apparatus 20, it is possible to directly acquire the motion signals by exciting the slab including organs such as the heart that are the collection targets of the motion signals.

In addition, according to the magnetic resonance imaging apparatus 20, other than the data for the imaging, the motion signals enough for the necessary range for the measurement of the amount of motion are collected at every heart beat, and it is thus possible to collect the motion signals from the same area at different timings. Therefore, in the magnetic resonance imaging apparatus 20, the amount of motion can be detected with a higher precision by using the motion signals from the same area and the detected amount of motion is used for executing the motion correction on the imaging signals. Then, with the magnetic resonance imaging apparatus 20, a satisfactory image in which the occurrence of the unsharpness or ghost is suppressed can be obtained.

Furthermore, in the magnetic resonance imaging apparatus 20, the motion signals can be collected for each of the plurality of areas at different timings, and thus the signal components that are reflected by the motion are selectively extracted from the detected motion signals and can be used for the motion correction. As a result, the influence from the area without motion is suppressed thereby making it possible to obtain the image to which the motion correction with a higher precision has been conducted. In addition, it is also possible to suppress the increase in the amount of processing associated with the motion correction.

Moreover, when the motion signals are collected with encoding in the two axial directions in the dummy shots, the spatial motion information can be acquired and also when the direction in which the motion is large is set as the readout direction, it is possible to obtain the motion information with the less amount of data collection at a high accuracy.

Next, a description will be given of a modification example of the motion signals acquired by the motion signal acquisition unit 42.

Figure 15:
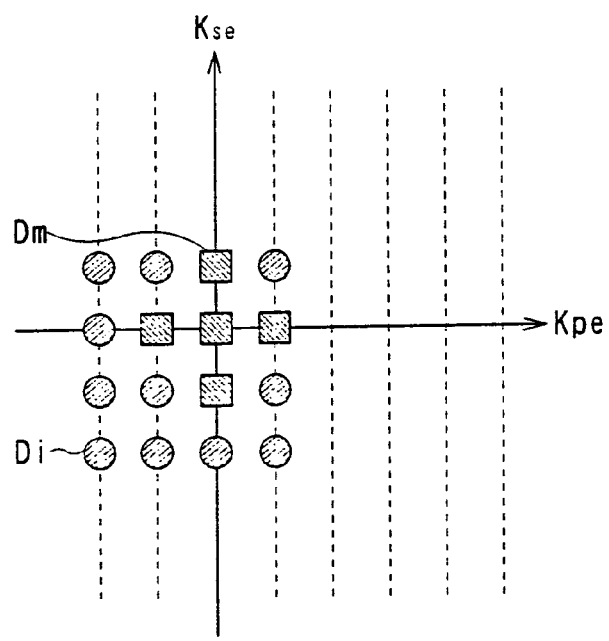
FIG. 15 is a diagram explaining a modification example of method for arranging motion signals in the k-space formed in the motion detection signal acquiring unit shown in FIG. 2.

FIG. 15 is a diagram explaining a modification example of method for arranging motion signals in the k-space formed in the motion detection signal acquiring unit 42 shown in FIG. 2.

As shown in FIG. 15, a part of the motion signals acquired by the motion signal acquisition unit 42 can be substituted by the imaging signals. In other words, the motion signal acquisition unit 42 acquires a part of the imaging signals and the thus acquired part of the imaging signals can be used as the motion signals.

A square mark in FIG. 15 represents the motion signal obtained in the dummy shot and a circle mark represents an imaging signal used instead of the motion signal. The motion signal from a part of close to the center of the k space has a small space frequency and is a motion signal from a large construction, so a high accuracy is required in many cases. In view of the above, the motion signals near the center of the k space are acquired by the dummy shots and the imaging signals are used for the rest part.

The dummy shot is applied at each heart beat (between the adjacent R waves), and thus the motion signals are updated at every heart beat. On the other hand, the substituted imaging signals are collected through the segment imaging and therefore the imaging signals are gradually obtained along with the progress in the segment imaging. Thus, the substituted imaging signal has always the fixed value and a part of the motion signals is not updated. However, in the case where the imaging signals are used for the motion signals at an area away from the k space, merely the motion signals from a small construction is not undated. Thus, when the detection of the motion signals from the large construction is requested, it is considerable that even if the motion signals from the small construction is not updated, the influence from this situation can be ignored in some cases.

On the other hand, a case in which there is an area where the data on the motion signal does not exist is equivalent to a case in which a mask processing is performed on the k space data. Therefore, if the image is reconstructed in a state where the number of the data on the motion signals is small, there is a risk in that information from an object included in other nearby pixel may interfere as an artifact. In view of the above, when the imaging signals are used for the motion signals, as compared with the case where the data on the motion signal does not exist, the generation of the artifact is suppressed and it is possible to find out the amount of motion with a high precision.

In this way, when the motion signal acquisition unit 42 is configured to acquire the imaging signals from the sequence controller control unit 41 to substitute the imaging signals for a part of the motion signals, the period of time required for the collection of the motion signals can be practically reduced and it is possible to improve the time efficiency for the collection of the motion signals. Therefore, the flexibility in the pulse sequence design in the segment imaging can be improved.

It should be noted that when the detection of the motion signals from the small construction is requested, the motion signals from a part being away from the center of k space in accordance with the size of the construction are collected by the dummy shots, and the imaging signals may be substituted for the motion signals in other parts. That is, when the motion signals only from a particular part of the k space are collected by the dummy shots and the motion signals are updated at every heart beat, it is possible to selectively collect the motion signals from the contraction having a desired size for a short period of time to find out the amount of motion.

The motion correction function of using the imaging signals for the part of the motion signals in the above-mentioned manner can be selected as the correction mode. For example, a button for switching On/Off of the motion correction function associated with the substitution of the imaging signals is displayed on the imaging condition setting screen displayed on the display unit 34, whereby the user can switch the correction modes arbitrarily.

Next, a description will be given of a modification example of the separation method for the motion signals by the motion signal component separation unit 44.

Figure 16:
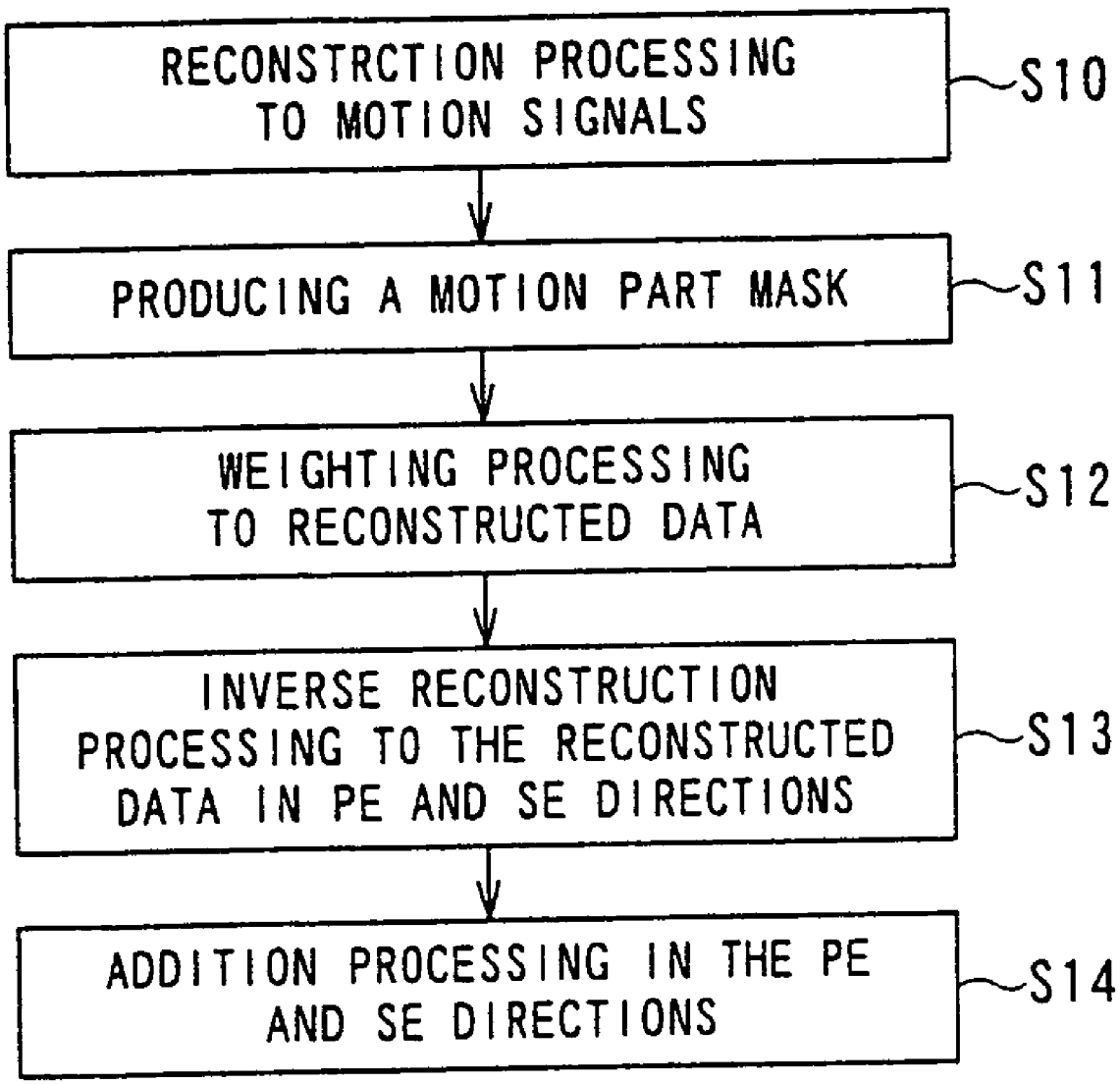
FIG. 16 is a flowchart explaining a modification example of method for separating motion signals by the motion signal component separating unit shown in FIG. 2.
Figure 17:
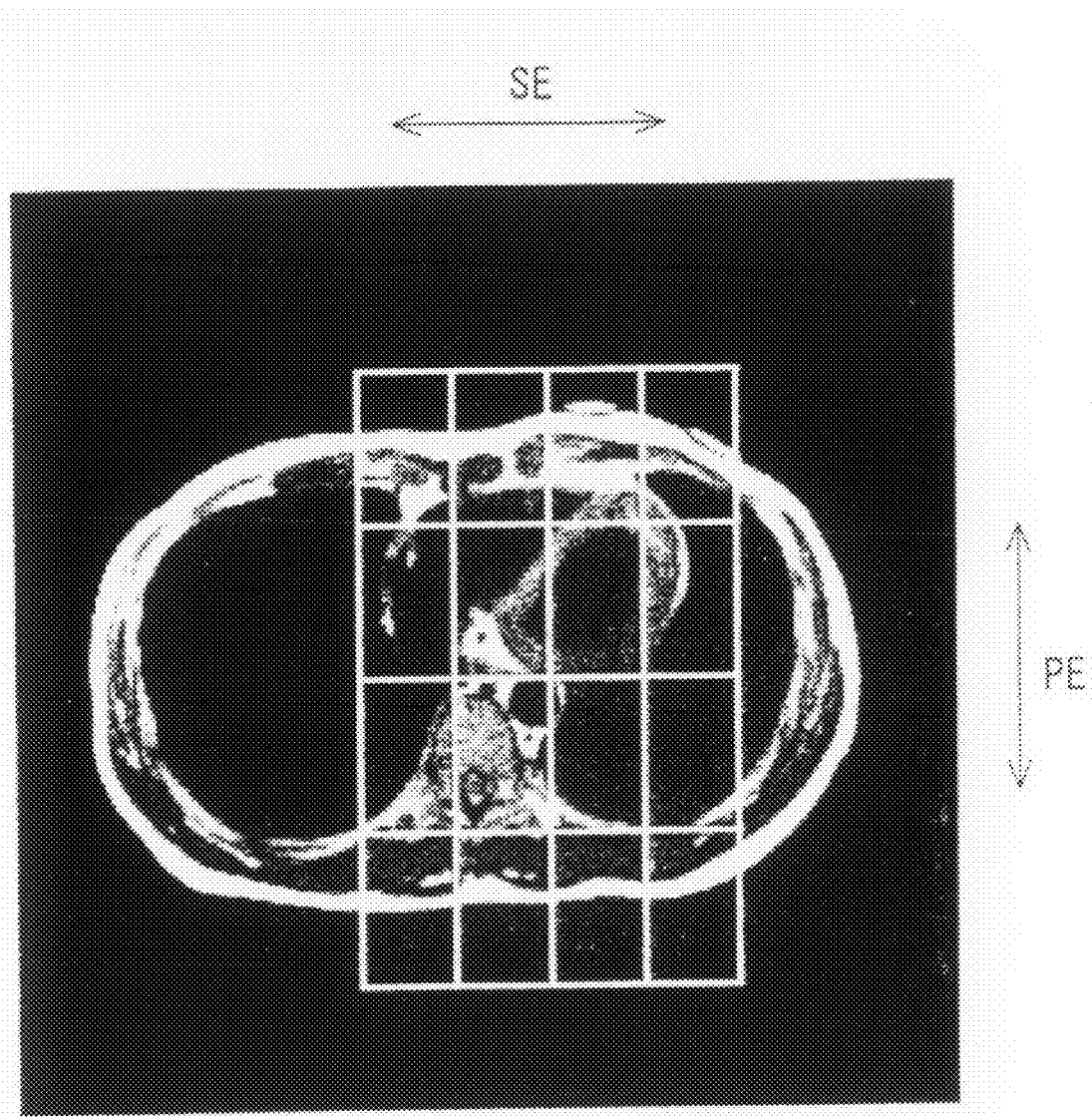
FIG. 17 is a diagram showing an example of area formed by the image reconstruction processing shown in FIG. 16.
Figure 18:
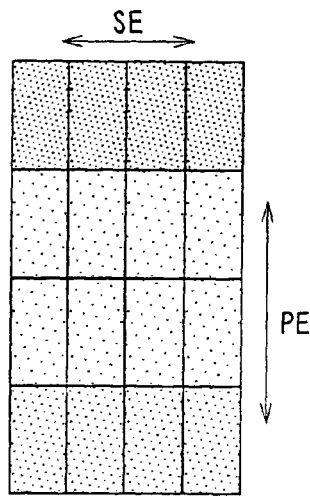
FIG. 18 is a conceptual diagram of the motion part mask shown in FIG. 16.

FIG. 16 is a flowchart explaining a modification example of method for separating motion signals by the motion signal component separating unit 44 shown in FIG. 2. The symbols including S with a number in FIG. 16 indicate each step of the flowchart. FIG. 17 is a diagram showing an example of area formed by the image reconstruction processing shown in FIG. 16. FIG. 18 is a conceptual diagram of the motion part mask shown in FIG. 16.

In Step S10 of FIG. 16, as described above, the motion signal component separation unit 44 acquires the motion signals arranged in the k space from the motion signal acquisition unit 42 to execute the image reconstruction processing on the motion signals. As a result, as shown in FIG. 17, it is possible to obtain the profile data in the readout direction in the areas of which the number is in accordance with the amount of encodes divided in the PE direction and the SE direction.

Next, in Step S11, the motion signal component separation unit 44 creates a motion part mask having a weight in accordance with the size of the motion on the basis of the profile data at each area. That is, as shown in FIG. 16, the motion part mask having different weight in one or both of the PE direction and the SE direction is created by the motion signal component separation unit 44. FIG. 16 shows an example of the motion part mask having a different weight only in the PE direction but a different weight may be set in the SE direction.

The weight of the motion part mask is set large in a pixel having an area with a large motion (the heart in this example), and on the other hand the weight is set small in a pixel having an area with a small motion or no signal (the chest wall or the like in this example). The size of the motion in each pixel can be obtained by referring to each of the profile data.

Next, in Step S12, the motion signal component separation unit 44 applies the motion part mask on the image reconstruction data obtained through the image reconstruction processing on the motion signals to execute a weighing processing with respect to the reconstruction data of the motion signals in the PE direction and the SE direction.

Next, in Step S13, the motion signal component separation unit 44 applies an inverse reconstruction processing on the reconstruction data after the weighing processing only in the PE direction and the SE direction.

Next, in Step S14, the motion signal component separation unit 44 adds the data, that is turned into the k space data only in the PE direction and the SE direction, in the PE direction and the SE direction.

As a result, it is possible to obtain the profile data of the motion reflected component in the readout direction shown in FIG. 11. This is equivalent to the case where the signal component in which the motion is reflected is separated. In this way, when the signal component in which the motion is reflected is obtained through the signal addition processing associated with the weighing in the encode direction, the SN ratio of the measurement for the motion reflected component can be made large and the detection accuracy for the amount of motion can be improved.

It should be noted that the separation method for the motion signals can also be selected by the user as the correction mode.

Figure 19:
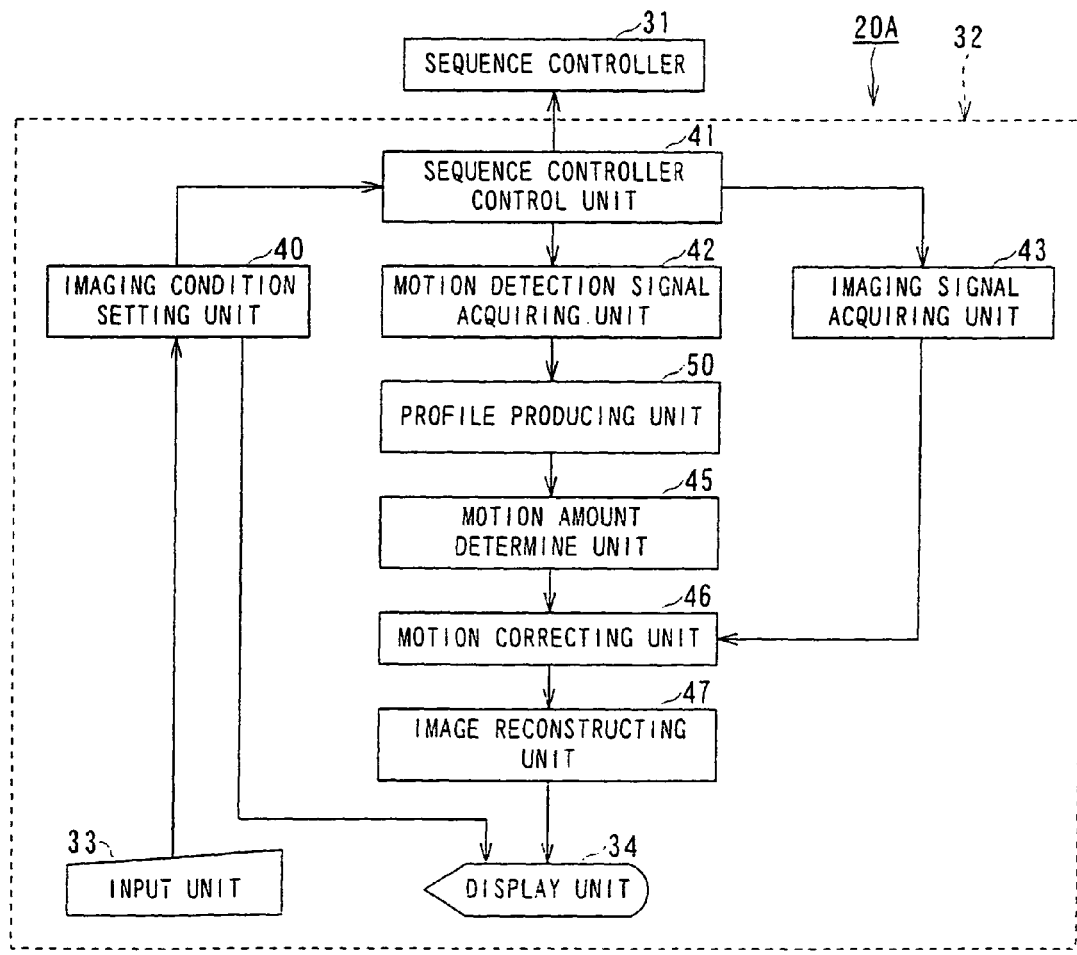
FIG. 19 is a block diagram showing a magnetic resonance imaging apparatus according to a second embodiment of the present invention.

FIG. 19 is a block diagram showing a magnetic resonance imaging apparatus according to a second embodiment of the present invention.

In a magnetic resonance imaging apparatus 20A shown in FIG. 19, a function of the imaging condition setting unit 40 and a point that a profile producing unit 50 instead of the motion signal component separating unit 44 is included are different from those of the magnetic resonance imaging apparatus 20 shown in FIG. 1. Other constructions and operations of the magnetic resonance imaging apparatus 20A are not different from those of the magnetic resonance imaging apparatus 20 shown in FIG. 1 substantially. Therefore, only a functional block diagram of the computer 20 is shown, attaching same number to a same component as that of the magnetic resonance imaging apparatus 20 and omitting explanation thereof.

The imaging condition setting unit 40 of the magnetic resonance imaging apparatus 20A is provided with a function of setting the pulse sequence capable of collecting the motion signals including the component in which the motion is reflected as main component in the dummy shots applied at timing sufficiently close to the data collection for the imaging.

Figure 20:
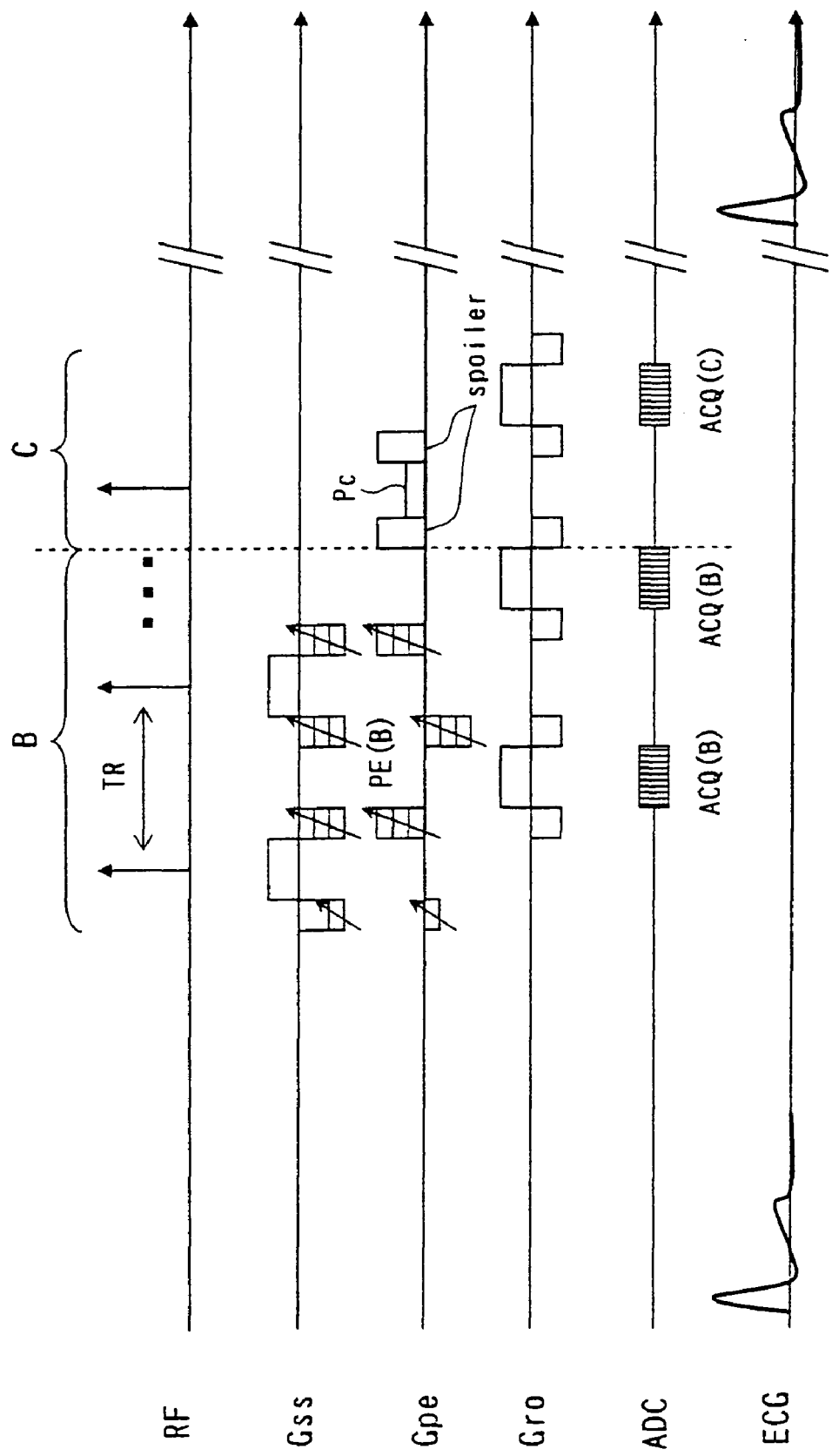
FIG. 20 is a diagram showing an example of pulse sequence produced by the imaging condition setting unit of the magnetic resonance imaging apparatus shown in FIG. 19.

FIG. 20 is a diagram showing an example of pulse sequence produced by the imaging condition setting unit 40 of the magnetic resonance imaging apparatus 20A shown in FIG. 19.

As shown in FIG. 20, the imaging condition setting unit 40 creates, for example, the part C that is the sequence for the dummy shot following the part B that is the sequence for the imaging. The part B is a sequence for the segment imaging for applying the RF signal in an extremely short repetition time TR while sequentially changing the phase encode pulse PE (B) for collecting the three dimensional imaging signal ACQ (B). In the part B, the slice direction is set as the sagittal surface direction including the heart.

Then, the part C is a sequence for collecting the motion signals having the component in which the motion is reflected as the main component. For that reason, the slice encode direction of the part C is set as a different direction from the slice encode direction of the part B and in the part C, the slice direction is set as the coronal surface direction including the heart. Furthermore, the part C is a sequence for applying a spoiler pulse before and after a slice gradient magnetic field pulse Pc. Then, the motion signal ACQ (c) having the component in which the motion is reflected by the thus constructed the part C as the main component is collected.

Figure 21:
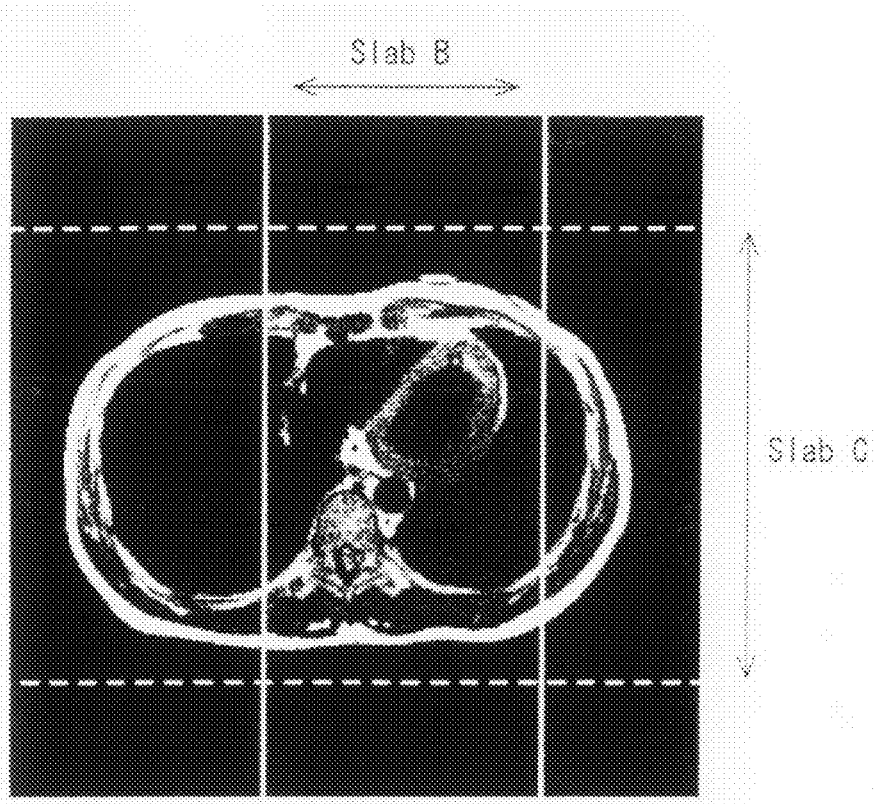
FIG. 21 is a diagram showing a slab position excited by the pulse sequence shown in FIG. 20.
Figure 22:
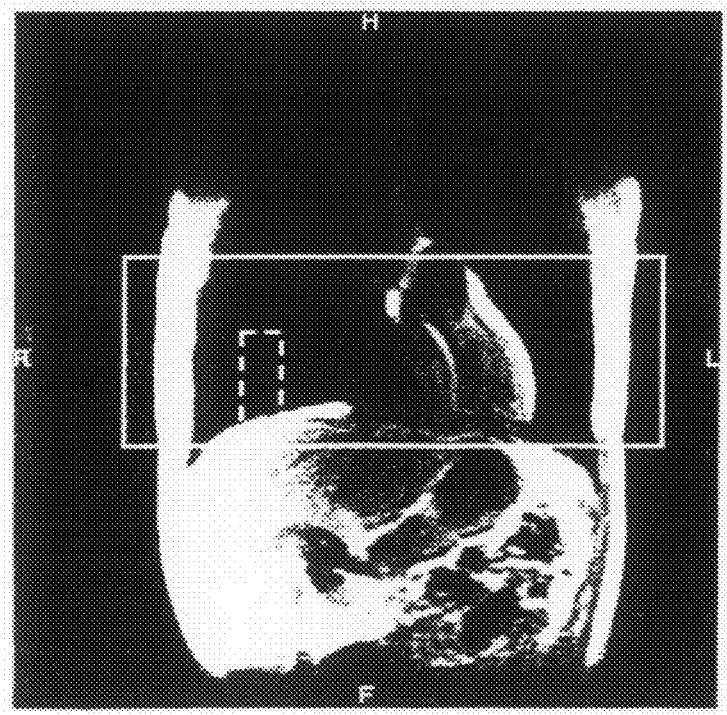
FIG. 22 is a diagram explaining an area for acquiring NMR signals for detecting motion of a diaphragma in a conventional magnetic resonance imaging apparatus.
Figure 23:
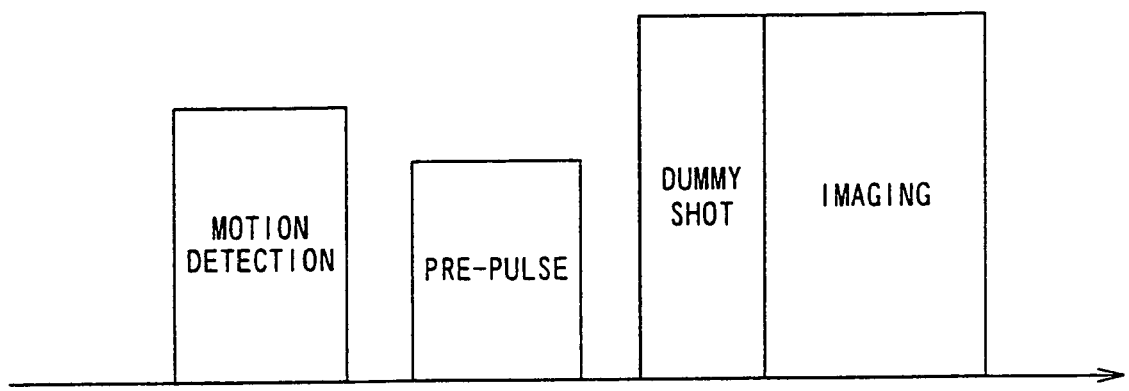
FIG. 23 is a diagram showing a conventional pulse sequence defining an imaging condition to acquire data for detecting motion and that for imaging shown in FIG. 22.

FIG. 21 is a diagram showing a slab position excited by the pulse sequence shown in FIG. 20.

As shown in FIG. 21, the slab B represented by the solid line with a slice gradient magnetic field pulse Gss in the part B of the pulse sequence shown in FIG. 20 is excited. Subsequently, the slab C represented by the dotted line with the slice gradient magnetic field pulse Pc of the part C is excited. Then, in the part C, the motion signal ACQ (C) is collected from the rectangular area surrounded by the dotted line and the solid line excited by the slice gradient magnetic field pulses Gss and Pc of both the part B and the part C.

Then, by controlling the slice gradient magnetic field pulse Pc of the part C and adjusting the position of the excited slab C, it is possible that the area having the motion such as the heart is selectively included in the rectangular area to the area without any motion. In this way when the slice gradient magnetic field pulse Pc of the part C is controlled such that the area having the motion is included in the rectangular area, it is possible to collect the motion signal ACQ (C) having the component in which the motion is reflected as the main component. As to the position of the slab C, there are a method of obtaining the position from the experimental data, a method of estimating the position on the basis of the previously collected motion information at each position, and the like.

On the other hand, the profile producing unit 50 has a function of acquiring the motion signals obtained through the data collection on the basis of the pulse sequence set by the imaging condition setting unit 40 from the motion signal acquisition unit 42 and a function of obtaining the profile data in the readout direction by performing the image reconstruction processing on the thus acquired motion signals. Furthermore, the profile producing unit 50 is configured to supply the thus obtained profile data to the motion amount determine unit 45 as the motion reflected component.

Then, in the magnetic resonance imaging apparatus 20A, the pulse sequence shown in FIG. 20 is created by the imaging condition setting unit 40 such that the slab including the area having the motion such as the heart is excited by the sequence for collecting the motion signals. Then, the motion signals collected following the collection of the imaging signals are supplied to the profile producing unit 50. The motion signals supplied to the profile producing unit 50 have the component in which the motion is reflected as the main component. In view of the above, the profile producing unit 50 performs the image reconstruction processing on the motion signals to obtain the profile data in the readout direction. Then, the profile producing unit 50 supplies the thus obtained profile data to the motion amount determine unit 45 as the motion reflected component. Furthermore, as in the case of the magnetic resonance imaging apparatus 20 shown in FIG. 1, the motion correction is executed on the imaging signals, thereby making it possible to obtain the image after the motion correction.

A part of elements and functions of the magnetic resonance imaging apparatuses 20 and 20A in each of the embodiments may be omitted and conversely the functions of the magnetic resonance imaging apparatuses 20 and 20A may be combined with each other. For example, such a configuration may be adopted that the motion signal component separation unit 44 of the magnetic resonance imaging apparatus 20 shown in FIG. 1 may be omitted and the profiles of all the motion signals are utilized as the motion reflected components to perform the motion correction. In addition, such a configuration may also be adopted that the magnetic resonance imaging apparatus 20A shown in FIG. 19 is provided with the motion signal component separation unit 44 and further the component in which the motion is reflected from is separated from the motion signals each having the component in which the motion is reflected as the main component.

In addition, in the above-mentioned magnetic resonance imaging apparatuses 20 and 20A, the example in which the correction processing on the imaging signals is performed on the basis of the amount of motion has been described, but the magnetic resonance imaging apparatuses 20 and 20A may be configured so as not to perform the correction processing and so as to select the imaging signals in a particular range for the image reconstruction. In this case, for example, the computer 32 is provided with an image signal selecting unit instead of the motion correcting unit 46.

The image signal selecting unit selects the imaging signals in the particular range among the thus acquired imaging signals from the imaging signal acquisition unit 43 on the basis of the amount of motion determined in the motion amount determine unit 45. As an example of the selection method for the imaging signals, there is one including creating a gating window in accordance with the amount of motion and selecting the imaging signals in the particular range from the imaging signals by using the gating window. For example, the gating window is created such that the imaging signals in a range where the amount of motion does not exceed a threshold are selected. With the thus created gating window, it is possible to remove the imaging signals showing the large motion from the imaging signals for the image reconstruction.

Then, the image reconstructing unit 47 uses the imaging signals selected by the image signal selecting unit to reconstruct an image. In this way, through the sorting out of the imaging signals, it is possible to obtain an image to which the influence of the motion is small and which is even closer to the reference image.

What is claimed is:

1. A magnetic resonance imaging apparatus comprising:
    an imaging signal acquisition unit configured to acquire magnetic resonance signals from an object as imaging signals;
    a motion signal acquisition unit configured to repetitively acquire magnetic resonance signals having a phase encoding amount less than that used for imaging signals as motion signals;
    a motion amount determination unit configured to obtain a motion amount using the motion signals;
    a selection unit configured to select imaging signals within a specific range in accordance with the motion amount;
    a motion correction unit configured to perform correction processing of the imaging signals or the selected imaging signals within the specific range in accordance with the motion amount; and
    an image reconstruction unit configured to reconstruct an image using the selected imaging signals within the specific range after the correction processing.

2. A magnetic resonance imaging apparatus according to claim 1, further comprising:
    a motion reflected component acquisition unit configured to acquire signal component reflecting a motion from the motion signals,
    wherein said motion amount determine unit is configured to obtain the motion amount from the signal component reflecting the motion.

3. A magnetic resonance imaging apparatus according to claim 1, wherein:
    said motion amount determine unit is configured to obtain the motion amount using motion signals acquired from a same part at a mutually different timings.

4. A magnetic resonance imaging apparatus according to claim 1, wherein:
    said motion signal acquisition unit is configured to acquire the motion signals with encoding in two axis directions.

5. A magnetic resonance imaging apparatus to claim 1 wherein:
    said motion signal acquisition unit is configured to acquire the motion signals from a same slab as an imaging slab for acquiring the imaging signals.

6. A magnetic resonance imaging apparatus according to claim 1, wherein:
    said motion signal acquisition unit is configured to acquire the motion signals by assigning a body axis direction of the object to a readout direction.

7. A magnetic resonance imaging apparatus according to claim 1, wherein:
    said motion signal acquisition unit is configured to acquire the motion signals at least one of before and after acquisition of the imaging signals.

8. A magnetic resonance imaging apparatus according to claim 1, further comprising:
    an imaging condition setting unit configured to set an imaging condition for acquiring the motion signals, the imaging condition including the phase encoding amount.

9. A magnetic resonance apparatus according to claim 1, wherein:
    said motion signal acquisition unit is configured to set a sequence for acquiring the motion signals so as to decrease a step amount of an encoding pulse for acquiring the motion signals gradually, and
    said imaging signal acquisition unit is configured to set a sequence for acquiring the imaging signals so as to increase a step amount of an encoding pulse for acquiring the imaging signals gradually.

10. A magnetic resonance imaging apparatus according to claim 1, wherein:
    said motion signal acquisition unit is configured to set a slab for acquiring the motion signals so as to include a part serving as a detection target of the motion amount in a rectangular area formed by the slab and an imaging slab for acquiring the imaging signals to acquire the motion signals from the rectangular area with a sequence for acquiring the motion signals subsequent to a sequence for acquiring the imaging signals, the slab being set in a direction different from the imaging slab.

11. A magnetic resonance imaging apparatus according to claim 1, wherein:
    said motion correction unit configured to perform the correction processing with linear expansion and contraction correction.

12. A magnetic resonance imaging apparatus according to claim 2, wherein:
    said motion reflected component acquisition unit is configured to produce a reconstructed data on an area by reconstructing the motion signals to obtain a profile of reconstructed data on at least one of the areas as the signal component reflecting the motion, the one showing a breath motion.

13. A magnetic resonance imaging apparatus according to claim 2, wherein:

said motion reflected component acquisition unit is configured to produce a reconstructed data on areas by reconstructing the motion signals to obtain a profile of reconstructed data obtained by weighting the reconstructed data on the areas respectively and subsequently adding processed data in an encode direction as the signal component reflecting the motion, the processed data being subjected to inverse reconstruction processing in the encode direction.

\* \* \* \* \*